(12) United States Patent
Onuki et al.

(10) Patent No.: US 11,239,272 B2
(45) Date of Patent: Feb. 1, 2022

(54) PHOTOELECTRIC CONVERSION APPARATUS HAVING METAL PORTION, IMAGING SYSTEM, MOVABLE BODY, AND SEMICONDUCTOR CHIP FOR STACKING

(71) Applicant: CANON KABUSHIKI KAISHA, Tokyo (JP)

(72) Inventors: Yusuke Onuki, Fujisawa (JP); Fumihiro Inui, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/661,903

(22) Filed: Oct. 23, 2019

(65) Prior Publication Data

US 2020/0135786 A1    Apr. 30, 2020

(30) Foreign Application Priority Data

Oct. 24, 2018    (JP) .............................. JP2018-200105

(51) Int. Cl.
  *H01L 27/146*   (2006.01)
  *H04N 5/341*    (2011.01)

(52) U.S. Cl.
  CPC .... *H01L 27/14629* (2013.01); *H01L 27/1463* (2013.01); *H01L 27/1464* (2013.01); *H01L 27/14612* (2013.01); *H01L 27/14636* (2013.01); *H04N 5/341* (2013.01)

(58) Field of Classification Search
  None
  See application file for complete search history.

(56) References Cited

U.S. PATENT DOCUMENTS

| | | | | |
|---|---|---|---|---|
| 7,944,493 | B2* | 5/2011 | Inagaki | H04N 5/341 |
| | | | | 348/308 |
| 2004/0099886 | A1* | 5/2004 | Rhodes | H01L 27/14609 |
| | | | | 257/222 |
| 2006/0086956 | A1* | 4/2006 | Furukawa | H01L 27/14629 |
| | | | | 257/291 |

(Continued)

FOREIGN PATENT DOCUMENTS

| | | |
|---|---|---|
| JP | 2006-41026 A | 2/2006 |
| JP | 2006-261372 A | 9/2006 |

(Continued)

*Primary Examiner* — Twyler L Haskins
*Assistant Examiner* — Wesley J Chiu
(74) *Attorney, Agent, or Firm* — Canon U.S.A., Inc. IP Division

(57) ABSTRACT

A photoelectric conversion apparatus includes a semiconductor substrate, a floating diffusion, an amplifying transistor, first and second contact plugs, a wire, and a metal portion. The semiconductor substrate has a first plane and a second plane to be entered by light, and includes a photoelectric conversion element. The amplifying transistor includes a first gate electrode. The first contact plug is connected to the floating diffusion. The second contact plug is connected to the first gate electrode. The wire is configured to electrically connect the first gate electrode and the floating diffusion to each other. The metal portion, which is arranged between the first plane and a third plane, covers at least a part of the photoelectric conversion element in a planar view, and has an opening over which at least a part of the wire is superimposed in a planar view.

25 Claims, 19 Drawing Sheets

(56) References Cited

U.S. PATENT DOCUMENTS

| | | | |
|---|---|---|---|
| 2008/0135963 A1* | 6/2008 | Akiyama | H01L 27/14603 257/432 |
| 2008/0179495 A1* | 7/2008 | Shimizu | H01L 27/14609 250/208.1 |
| 2009/0200586 A1* | 8/2009 | Mao | H01L 27/14643 257/292 |
| 2010/0025790 A1* | 2/2010 | Jang | H01L 27/14625 257/432 |
| 2011/0234830 A1* | 9/2011 | Kiyota | H01L 27/14647 348/222.1 |
| 2014/0111663 A1* | 4/2014 | Soda | H01L 27/14685 348/222.1 |
| 2014/0118602 A1* | 5/2014 | Shinohara | H01L 27/14629 348/340 |
| 2014/0151753 A1* | 6/2014 | Konishi | H01L 27/14689 257/222 |
| 2015/0281560 A1* | 10/2015 | Inoue | H04N 5/36961 348/222.1 |
| 2016/0181294 A1* | 6/2016 | Zhao | H01L 27/1462 257/292 |
| 2016/0352959 A1* | 12/2016 | Negishi | H04N 5/23293 |
| 2017/0201702 A1* | 7/2017 | Niwa | H01L 27/14645 |
| 2019/0252442 A1* | 8/2019 | Tanaka | H01L 31/107 |

FOREIGN PATENT DOCUMENTS

| | | |
|---|---|---|
| JP | 2014-115501 A | 6/2014 |
| JP | 2017-216480 A | 12/2017 |
| JP | 2018-133575 A | 8/2018 |

\* cited by examiner

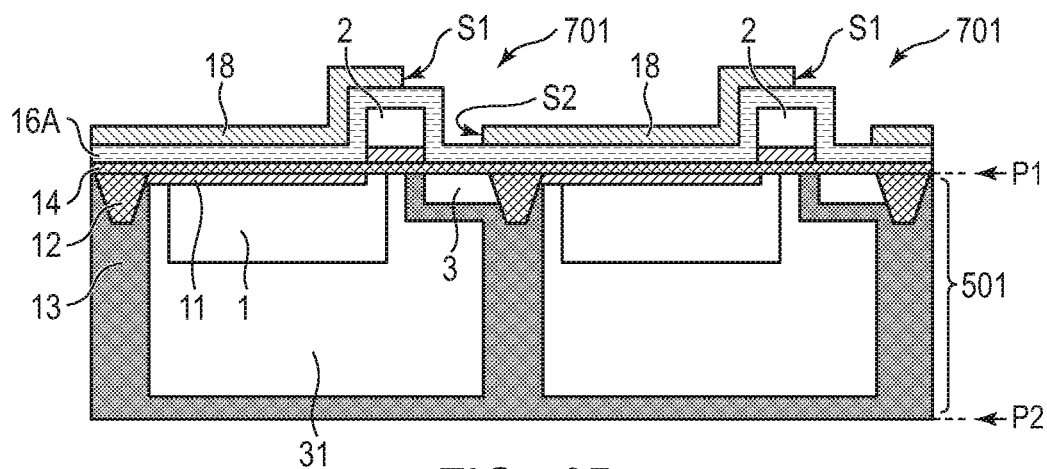
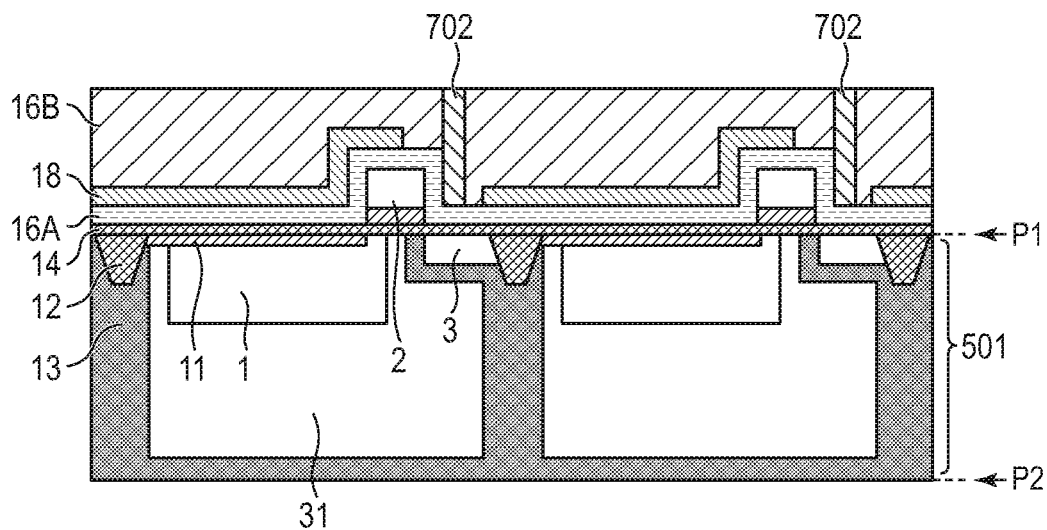
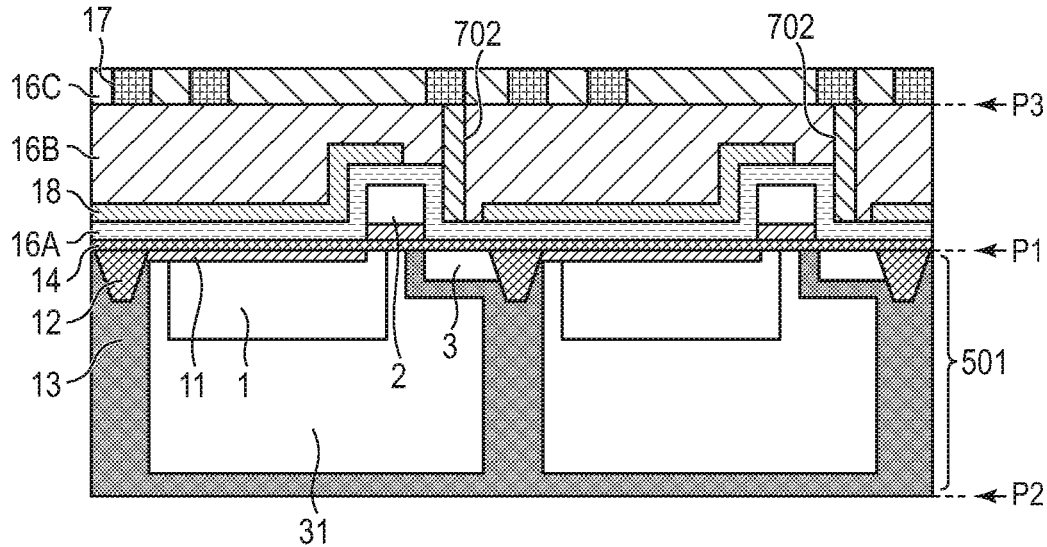

FIG. 18A  FIG. 18B
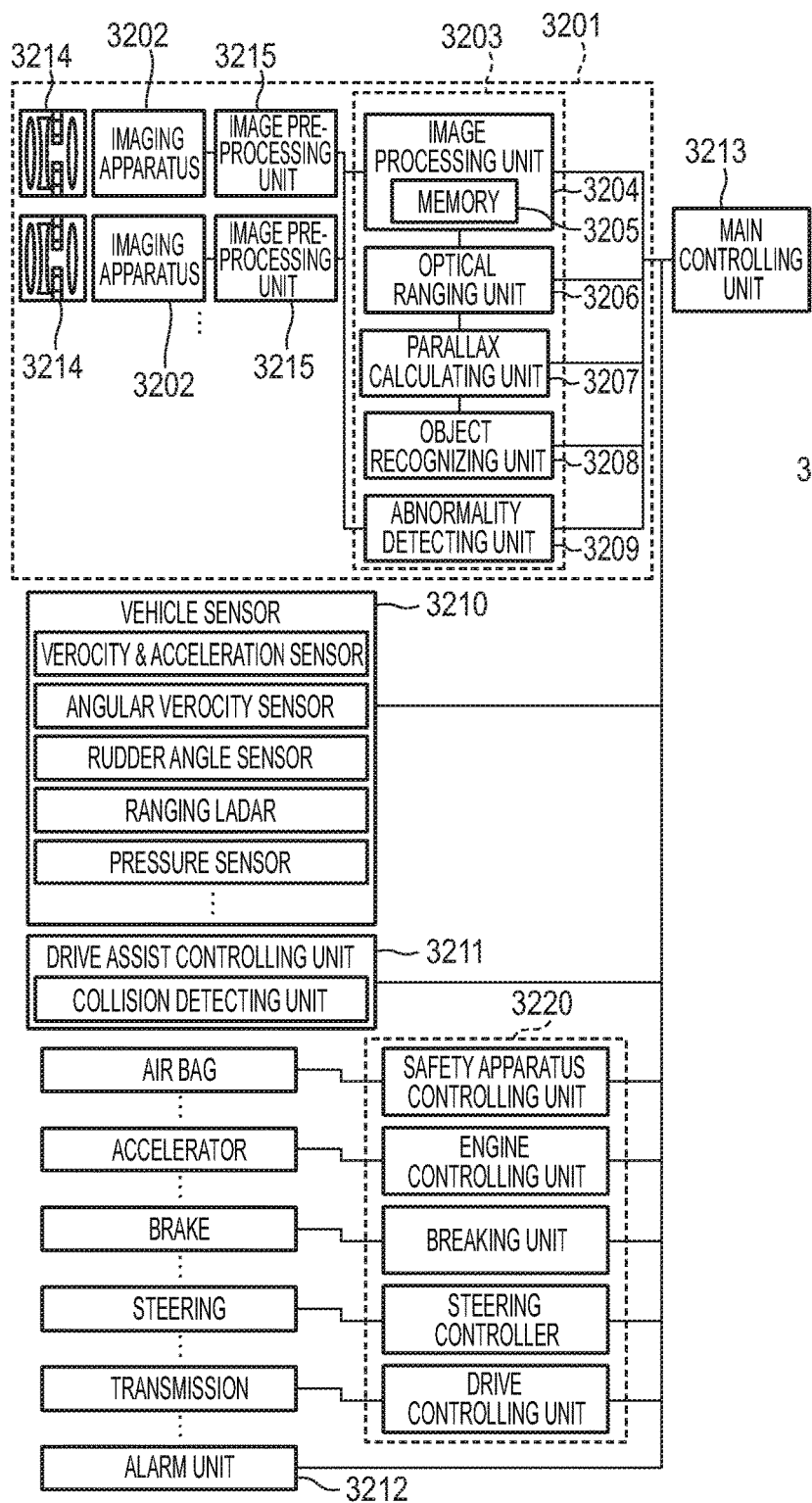
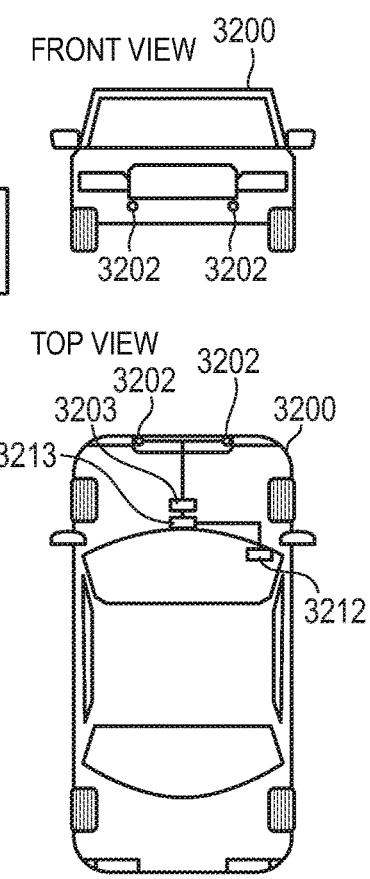
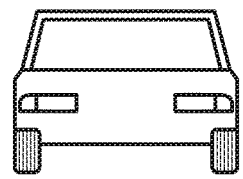

PHOTOELECTRIC CONVERSION APPARATUS HAVING METAL PORTION, IMAGING SYSTEM, MOVABLE BODY, AND SEMICONDUCTOR CHIP FOR STACKING

BACKGROUND

Field

One disclosed aspect of the embodiments relates to a photoelectric conversion apparatus, an imaging system, a movable body, and a semiconductor substrate for stacking.

Description of the Related Art

In recent years, there has been proposed a back-illuminated imaging apparatus. The back-illuminated imaging apparatus receives light from a back surface, which is a surface on the opposite side to a surface of a semiconductor substrate on which electrodes and wiring layers are arranged, to generate a signal. In such a back-illuminated imaging apparatus, long-wavelength light may be transmitted through the semiconductor substrate. In Japanese Patent Application Laid-Open No. 2006-261372, there is proposed a configuration in which a metal reflection film is provided closer to the semiconductor substrate than to a wiring layer. The transmitted light is reduced by the reflection film, to thereby improve sensitivity and prevent color mixture.

SUMMARY

According to one aspect of the embodiments, a photoelectric conversion apparatus includes a semiconductor substrate, a floating diffusion, an amplifying transistor, a first contact plug, a second contact plug, a wire, and a metal portion. The semiconductor substrate has a first plane and a second plane to be entered by light, and includes a photoelectric conversion element. The floating diffusion is arranged on a first plane side of the semiconductor substrate, and is configured to hold a charge generated by the photoelectric conversion element. The amplifying transistor is arranged on the first plane side of the semiconductor substrate, and includes a first gate electrode. The first contact plug is arranged on the first plane side of the semiconductor substrate, and is connected to the floating diffusion. The second contact plug is arranged on the first plane side of the semiconductor substrate, and is connected to the first gate electrode. The wire is arranged on the first plane side of the semiconductor substrate. It has a first part connected to the first contact plug, a second part connected to the second contact plug, and a third part between the first part and the second part, and is configured to electrically connect the first gate electrode and the floating diffusion to each other. The metal portion is arranged between the first plane and a third plane including a plane of the first contact plug on which the first contact plug is connected to the wire, and covers at least a part of the photoelectric conversion element in a planar view. The metal portion has an opening over which at least a part of the third part of the wire is superimposed in a planar view.

Further features of the disclosure will become apparent from the following description of exemplary embodiments with reference to the attached drawings.

BRIEF DESCRIPTION OF THE DRAWINGS

FIG. 9A, FIG. 9B, and FIG. 9C are schematic cross-sectional views for illustrating a manufacturing method for the photoelectric conversion apparatus according to Example 2.

FIG. 18A is a schematic diagram for illustrating a configuration of a movable body, and FIG. 18B is a schematic view for illustrating a configuration of the movable body.

DESCRIPTION OF THE EMBODIMENTS

Now, examples of the disclosure are described in detail. Each of the examples described below is merely at least one of embodiments of the disclosure, and the disclosure is not limited thereto. In each of the accompanying drawings, the same component may be denoted by the same reference symbol to omit a description thereof. When a plurality of given components are present, a representative component may be denoted by a reference symbol to omit the reference symbol denoting the other components.

Figure 1:
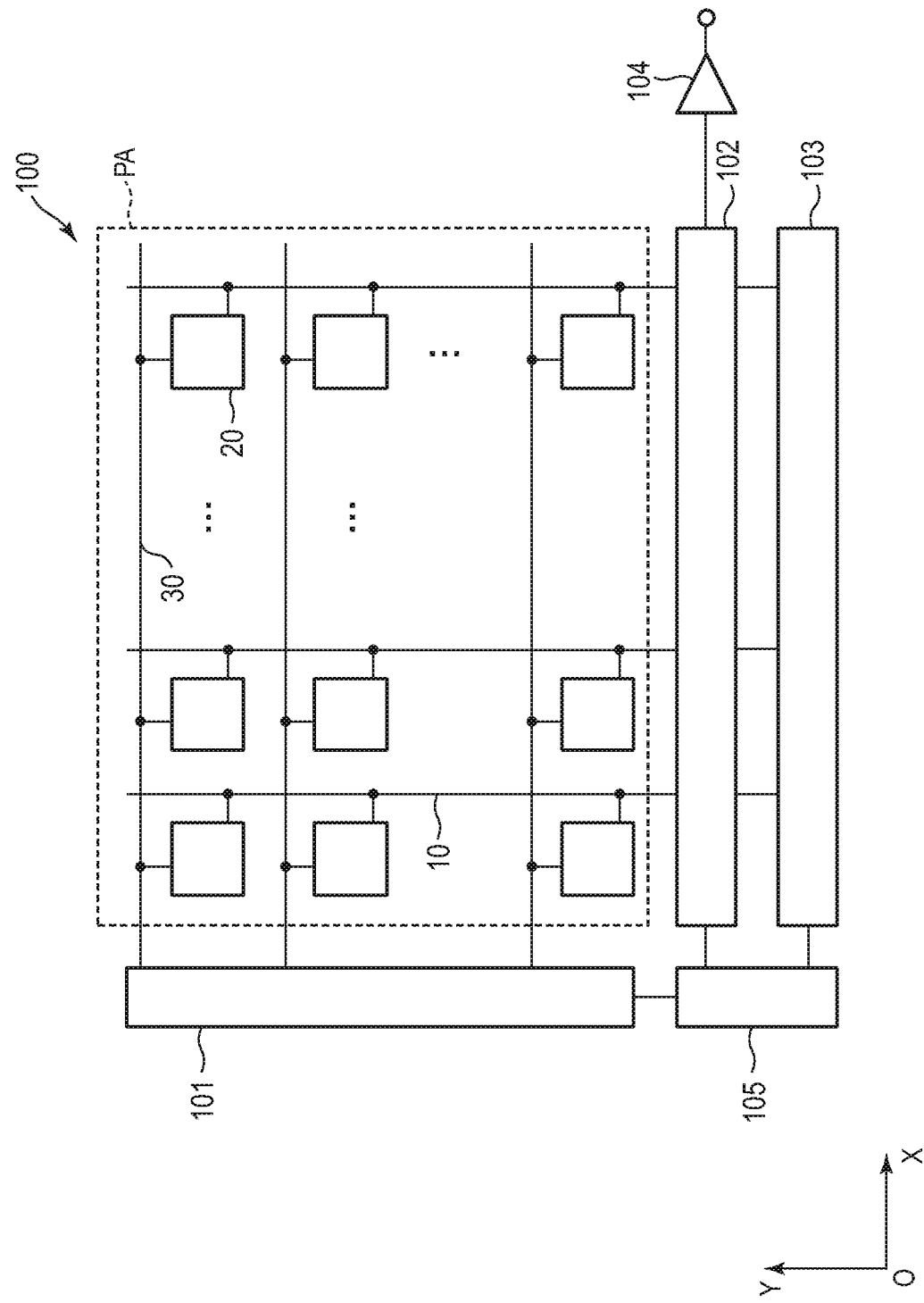
FIG. 1 is a block diagram for illustrating a photoelectric conversion apparatus according to Example 1 of the disclosure.

The following descriptions of the examples are directed to a case in which an electron is used as a signal charge, but a hole may be used as a signal charge. In this case, a conductivity type of each portion can become the opposite conductivity type. In the following descriptions of the examples, a planar view is an orthographic projection view of each of elements on the plane of a substrate on which the elements are arranged. The plane of the substrate is, for example, a plane P1, First Example A photoelectric conversion apparatus according to Example 1 of the present disclosure is described with reference to FIG. 1, FIG. 2, FIG. 3, FIG. 4A, and FIG. 4B. FIG. 1 is a block diagram for illustrating the photoelectric conversion apparatus according to Example 1. A photoelectric conversion apparatus 100 includes a photoelectric conversion region PA, a vertical scanning circuit 101, a signal processing circuit 102, a horizontal scanning circuit 103, an output circuit 104, and a control circuit 105. The photoelectric conversion region PA includes a plurality of unit cells 20 arranged in a two-dimensional matrix. The column direction is set as the X direction, and the row direction is set as the Y direction. The direction perpendicular to the row and column directions is set as the Z direction. In this case, when the photoelectric conversion apparatus performs imaging, a unit cell may correspond to a pixel, and a photoelectric conversion region may correspond to a pixel region.

The vertical scanning circuit 101 supplies a signal to the unit cell 20 through a control line 40. This signal includes a control signal for controlling a transistor of the unit cell 20 and a power supply voltage for operating the transistor of the unit cell 20. A common signal is supplied to the unit cells 20 in the same row. As the vertical scanning circuit 101, a shift register, an address decoder, or other such logic circuit can be used. One vertical signal line 10 is provided for a plurality of unit cells 20 in each column, and signals from the plurality of unit cells 20 are read out to the vertical signal line 10. The signal processing circuit 102 performs various kinds of processing on the signals output from the vertical signal line 10. The signal processing circuit 102 performs, for example, signal amplification processing, correlated double sampling processing with a reference signal and a signal based on light at a time of resetting or other such time, and analog-to-digital conversion processing. The horizontal scanning circuit 103 supplies a control signal for controlling the signal processing circuit 102. The horizontal scanning circuit 103 also supplies a control signal for outputting from the output circuit 104 a signal that has been subjected to signal processing by the signal processing circuit 102. The output circuit 104 outputs a signal from the signal processing circuit 102 to an external apparatus of the photoelectric conversion apparatus 100. The output circuit 104 can include, for example, a buffer amplifier, a differential amplifier, and a multiplex circuit.

Figure 2:
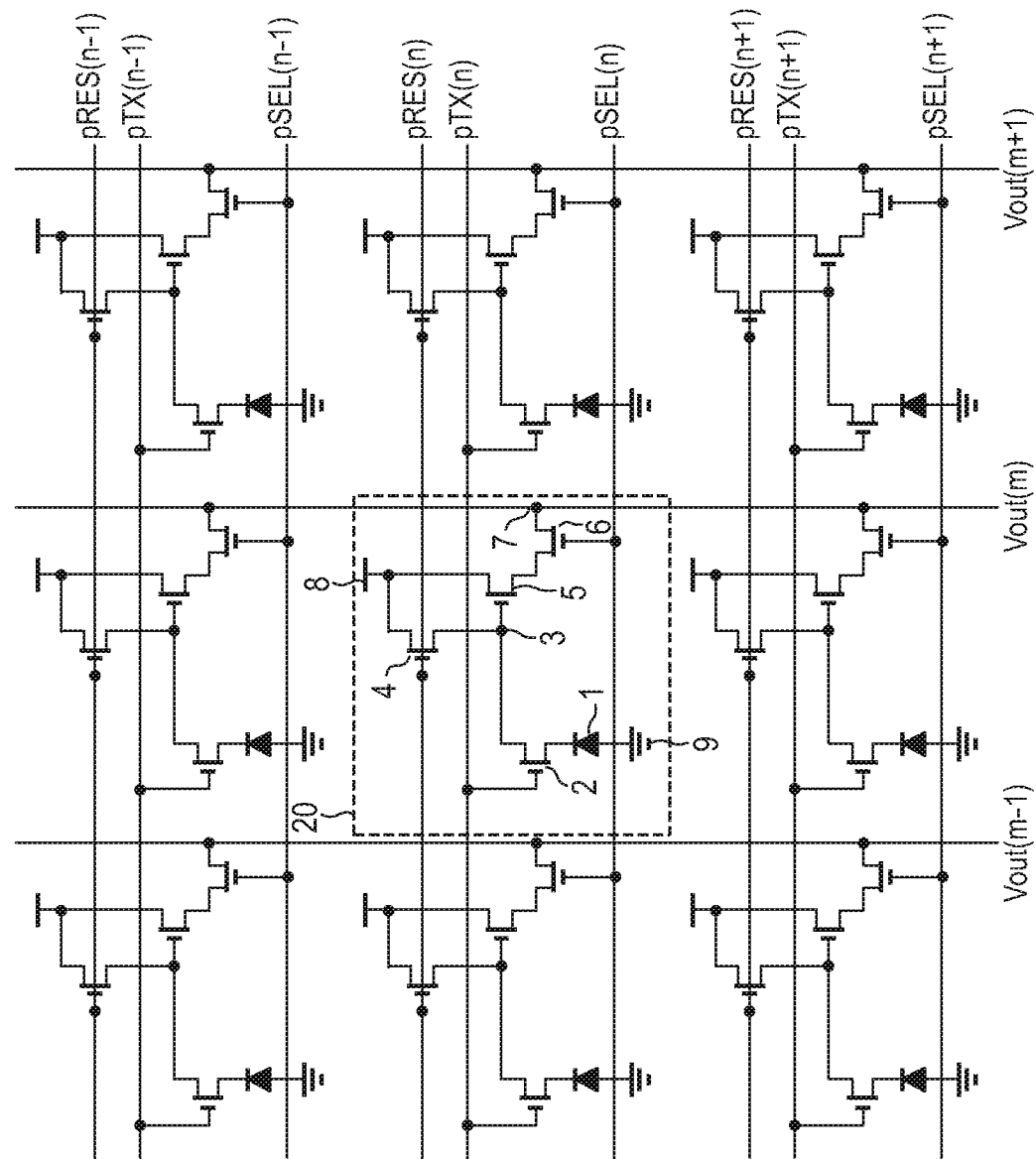
FIG. 2 is a circuit diagram for illustrating the photoelectric conversion apparatus according to Example 1.

FIG. 2 is a circuit diagram for illustrating the photoelectric conversion apparatus according to Example 1. In FIG. 2, a circuit of the photoelectric conversion region PA is illustrated. In FIG. 2, nine unit cells 20 arranged in three rows from an (n−1) th row to an (n+1) th row and three columns from an (m−1) th column to an (m+1) th column, which are a part of the plurality of unit cells 20 arranged in a matrix. In this case, the nine unit cells 20 can be recognized as being arranged in three rows by three columns. It can be recognized that the unit cell 20 in the (n−1) th row is arranged along a given direction, and the unit cell 20 in the n-th row is arranged along another direction parallel to the given direction.

The unit cell 20 in Example 1 includes a photoelectric conversion element 1, a transfer transistor 2, a floating diffusion 3 (hereinafter referred to as "FD"), a reset transistor 4, an amplifying transistor 5, and a selection transistor 6. The unit cell 20 may include a plurality of photoelectric conversion elements and a plurality of selection transistors, or may include a capacitor or other such element. The unit cell 20 also share a freely-selected element, for example, the reset transistor 4 or the amplifying transistor 5, with another unit cell 20. The photoelectric conversion element can photoelectrically convert incident light and accumulate charges obtained through the photoelectric conversion. The respective unit cells 20 have basically the same structure. In the following drawings, for the sake of description, the reference symbols of components forming one unit cell 20 may be assigned to a plurality of cells.

The photoelectric conversion element is, for example, a photodiode, but may be a photogate or a PIN photodiode. The transfer transistor 2 includes a gate electrode, and can control conduction between the photoelectric conversion element 1 and the FD 3. When the transfer transistor 2 is turned on, the charge of the photoelectric conversion element 1 is transferred to the FD 3. The FD 3 holds the charge of the photoelectric conversion element 1. The amplifying transistor 5 forms a source follower and outputs a signal based on the potential of the FD 3. The selection transistor 6 controls conduction between the amplifying transistor 5 and the vertical signal line 10. The reset transistor 4 controls conduction between the FD 3 and the power supply terminal 8, and can reset the potential of the FD 3 to a predetermined potential. The reset transistor 4 and the amplifying transistor 5 are connected to a common power supply terminal 8, but may be connected to different power supply terminals.

As the control line 40 illustrated in FIG. 1, at least three control lines are included in FIG. 2. In FIG. 2, the control line 40 includes lines for a control signal pTX of the transfer transistor 2, a control signal pRES of the reset transistor 4, and a control signal pSEL of the selection transistor 6. In this case, the parentheses indicate the position of each row. For example, the control signals supplied to the n-th row are the control signals pTX(n), pRES(n), and pSEL(n). Each transistor is turned on when the control signal is at a high level, and turned off when the control signal is at a low level. Meanwhile, as the vertical signal line 10 illustrated in FIG. 1, one vertical signal line Vout is included in FIG. 2 as well. The vertical signal line Vout is arranged for each unit cell column, and the vertical signal line arranged in the m-th column is a vertical signal line Vout(m).

Figure 3:
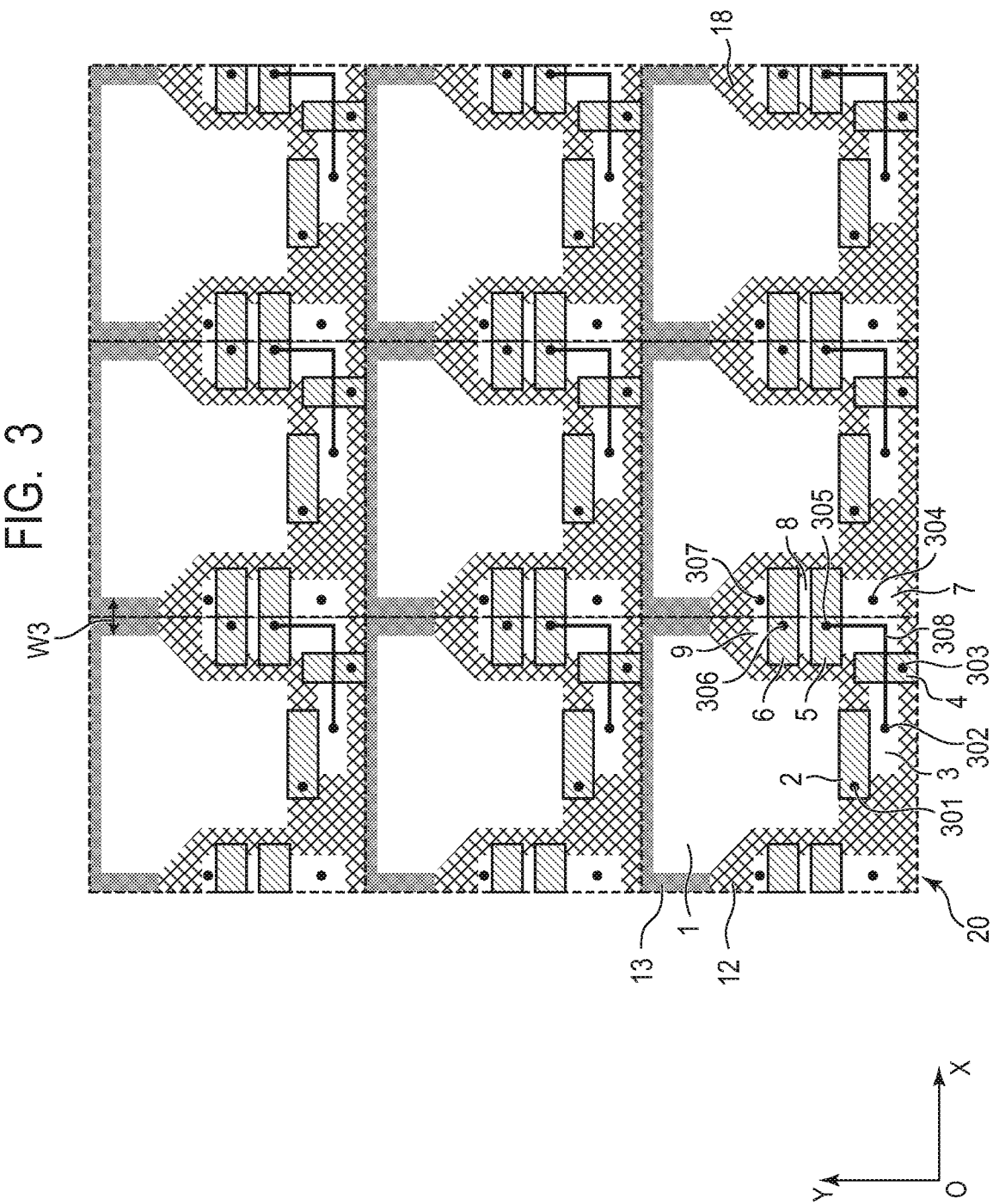
FIG. 3 is a schematic planar view for illustrating the photoelectric conversion apparatus according to Example 1.

FIG. 3 is a schematic planar view of the photoelectric conversion region PA illustrated in FIG. 2. FIG. 3 is an orthographic projection view of each of elements on the plane of a substrate on which the elements are arranged. In FIG. 3, a structure excluding a metal portion is illustrated for better understanding. In FIG. 3, the unit cells 20 are arranged three by three in the same manner as in FIG. 2. A gate electrode 2 of a transfer transistor is arranged between the photoelectric conversion element 1 and the FD 3. The transfer transistor controls conduction between the photoelectric conversion element 1 and the FD 3. A reset transistor includes a gate electrode 4, the FD 3, and a source/drain region 7 connected to a power supply. The reset transistor controls conduction between the FD 3 and the node of the power supply. A gate electrode 5 of an amplifying transistor uses the same node as the FD 3. The amplifying transistor includes the gate electrode 5, the source/drain region 7, and a source/drain region 8. The selection transistor includes a gate electrode 6, the source/drain region 8, and a source/drain region 9. The source/drain region 8 is connected to the power supply terminal 8 illustrated in FIG. 2, and is shared by the amplifying transistor and the selection transistor. A signal of the unit cell 20 is output from the source/drain region 9. Each element is provided in an active region defined by an element isolation portion 12. In Example 1, elements in the active region are isolated by an isolation region 13 formed of, for example, a semiconductor region. The isolation region 13 between the photoelectric conversion element 1 of one unit cell 20 and the photoelectric conversion element 1 of another unit cell 20 adjacent thereto in the X direction has a width W3 in a planar view.

Contacts 301 to 307 are connected to the gate electrodes and source/drain regions, and electrically connect the gate electrode and the source/drain regions to the wiring layer. The contact 301 is a contact located on the gate electrode 2, for supplying a control signal to the gate electrode 2. The contact 302 is a contact located on the FD 3, for electrically connecting the FD 3 and the gate electrode 5 to each other. The contact 303 is a contact located on the gate electrode 4, for supplying a control signal to the gate electrode 4. The contact 304 is a contact located on the source/drain region 7, for electrically connecting the source/drain region 7 and the power supply wire to each other.

The contact 305 is a contact located on the gate electrode 5, for electrically connecting the FD 3 and the gate electrode 5 to each other. The contact 306 is a contact located on the gate electrode 6, for supplying a control signal to the gate electrode 6. The contact 307 is a contact located above the source/drain region 9, for electrically connecting to a signal line for outputting the signal of the unit cell 20. A wire 308, the contact 302, and the contact 305 are included in a path for electrically connecting the FD 3 and the gate electrode 5 to each other. The wire 308, the contact 302, and the contact 305 form the same node as the FD 3. The contact is formed of a contact plug.

Figure 4A:
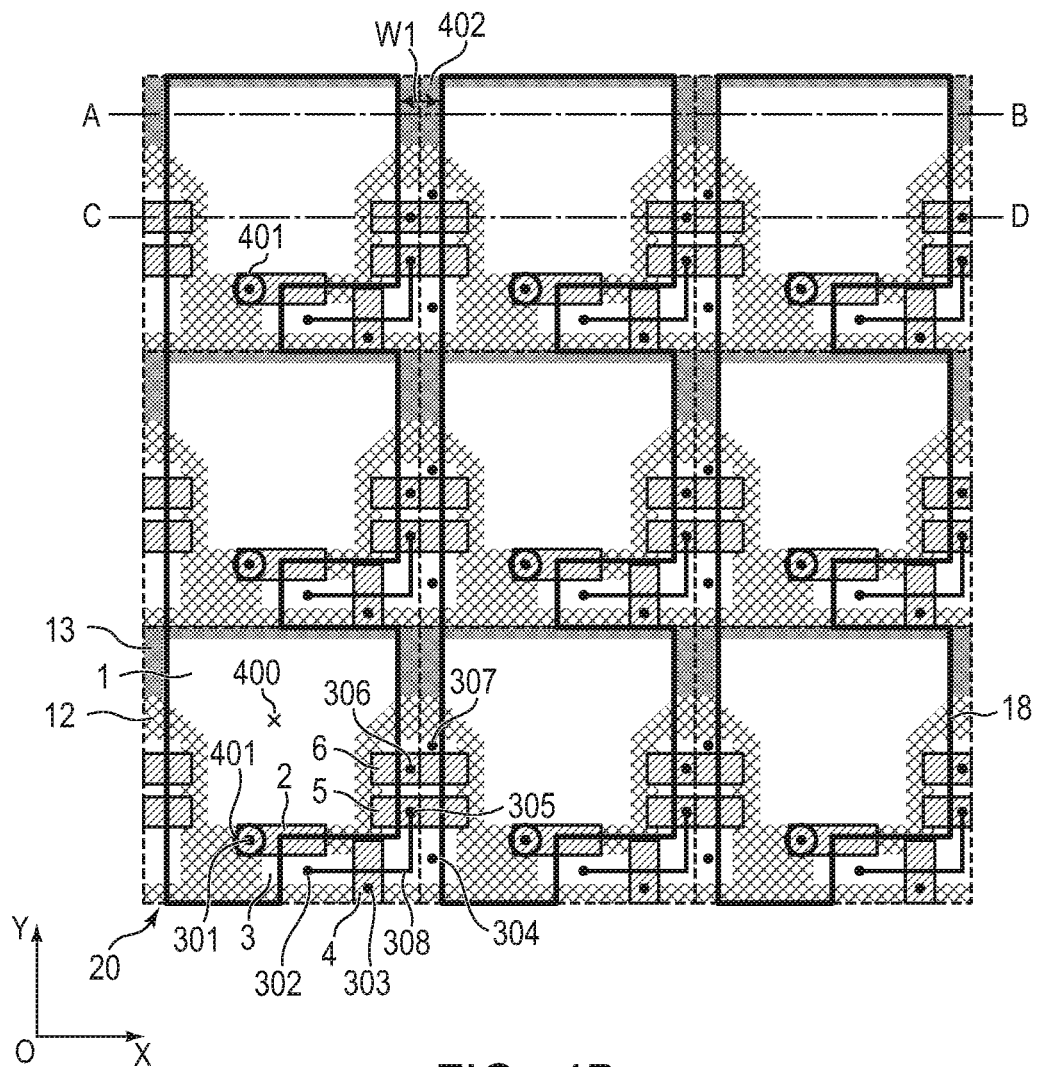
FIG. 4A is a schematic planar view for illustrating the photoelectric conversion apparatus according to Example 1.

FIG. 4A is a schematic planar view for illustrating the photoelectric conversion apparatus according to Example 1. In Example 1, a metal portion 18 is provided to the unit cell 20 having the structure illustrated in FIG. 3. FIG. 4A is a plan layout view in which the metal portion 18 is overlaid on the unit cell 20 illustrated in FIG. 3. The metal portion 18 is arranged in each unit cell column. The metal portion 18 extends over a plurality of unit cells in the column direction.

In the planar view of FIG. 4A, the metal portion 18 has an opening 402 over which at least a part of the wire 308 is superimposed. The at least a part of the wire 308 also corresponds to a section extending from a part superimposed over the contact 302 to a part superimposed over the contact 305. In Example 1, the entirety of the wire 308 is superimposed over the opening 402, and the opening 402 encloses the wire 308. The wire 308 forms the same node as the FD 3 as described above. The wire 308 and the metal portion 18 are located relatively close to each other in the direction perpendicular to the plane, and when the wire 308 is superimposed over the metal portion 18, a parasitic capacitance is formed therebetween. This allows the opening 402 formed as described in Example 1 to reduce the capacitance to be added to the wire 308. Therefore, according to the configuration of Example 1, it is possible to suppress an increase in capacitance of the FD 3.

In addition, an opening 401 is formed to the metal portion 18. The opening 401 is an opening for the contact 301 located on the gate electrode 2 and connected to the gate electrode 2. The diameter of the opening 401 is larger than the diameter of the contact 301, and the area of the opening 401 is larger than the area of the contact 301. The metal portion 18 also has the opening 402 located above the FD 3. The opening 402 exposes at least a part of the FD 3. The area of the opening 402 is larger than the area of the contact 302. The opening 401 and the opening 402 are further described below.

Figure 4B:
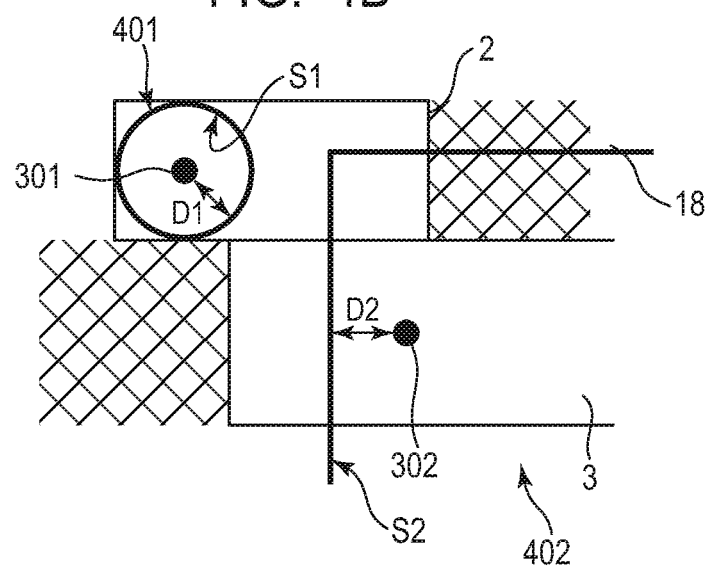
FIG. 4B is a schematic planar view for illustrating an enlarged part of FIG. 4A.

FIG. 4B is an illustration of an enlarged part of the gate electrode 2 illustrated in FIG. 4A. The metal portion 18 is located above the gate electrode 2 and a part of the FD 3. The metal portion 18 also has the opening 401 located above the gate electrode 2 and the opening 402 located above the FD 3. A side plane S1 of the metal portion 18 forms the opening 401, and a side plane S2 of the metal portion 18 forms the opening 402. In this case, it is assumed that a distance between the side plane S1 and the contact 301 connected to the gate electrode 2 is a distance D1, and a distance between the side plane S2 and the contact 302 connected to the FD 3 is a distance D2. At this time, the distance D1 is shorter than the distance D2. The same applies to the contact 305 being the same node as the FD 3, in which the distance from the metal portion 18 is set longer in the same manner as in the case of the contact 302. That is, the metal portion 18 is not provided above the FD 3 or around the contact 302 or other such contact. With such a structure, it is possible to reduce the capacitance (parasitic capacitance) formed by the metal portion 18 and the contact 302 or other such contact that forms the FD 3 or the same node as the FD 3. The distance represents the shortest distance.

In addition, the opening 402 extending in the Y direction is formed between a part of the metal portion 18 provided for one unit cell and a part of the metal portion 18 provided for another unit cell. The opening 402 can also be recognized as a groove or a slit. The opening 402 has a width W1. The opening 402 is arranged over the plurality of unit cells 20 along the Y direction, and is longer than the length of one unit cell 20 in the Y direction. By thus forming the opening 402 between the plurality of photoelectric conversion elements 1, it is possible to reduce the mixing of reflected light into another unit cell. For example, the width W1 is preferred to be about 0.1 μm to about 0.2 μm when the unit cell size is 1 μm in size. For each unit cell, the width W1 is half of about 0.1 μm to about 0.2 μm. That is, the width W1 is 5% to 10% of the unit cell size. In this case, the metal portion 18 can also be recognized as covering 80% to 90% of the photoelectric conversion element. The width W1 is preferred to be longer than the width W3 of the isolation region 13 illustrated in FIG. 3. The photoelectric conversion apparatus having the opening 402 is described with reference to FIG. 5A, FIG. 5B, and FIG. 6.

Figure 5A:
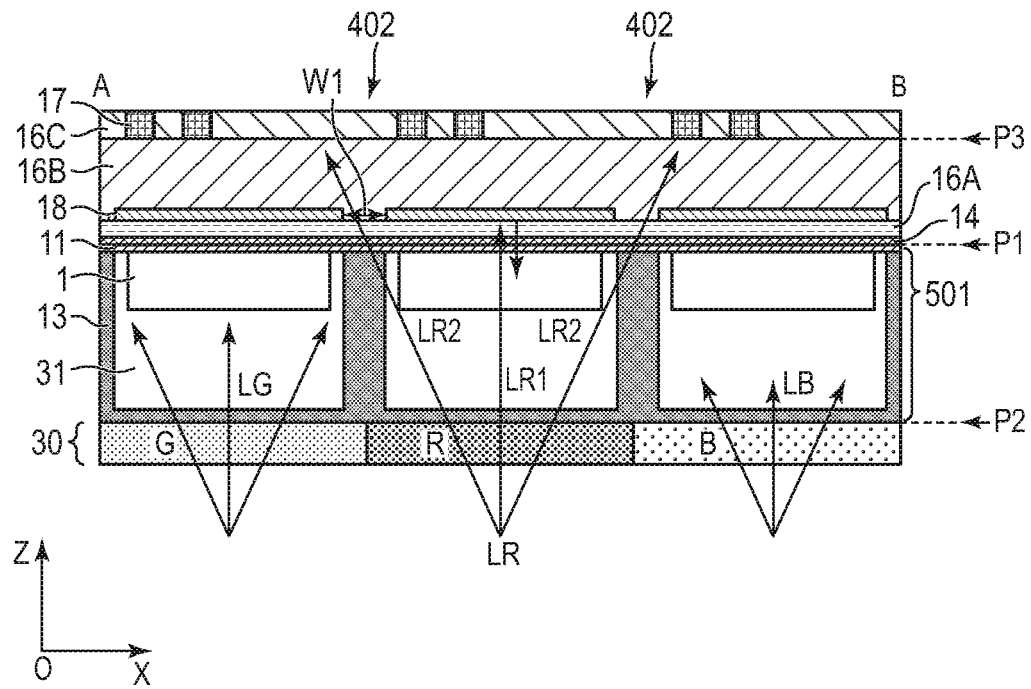
FIG. 5A is a schematic cross-sectional view for illustrating the photoelectric conversion apparatus according to Example 1.
Figure 5B:
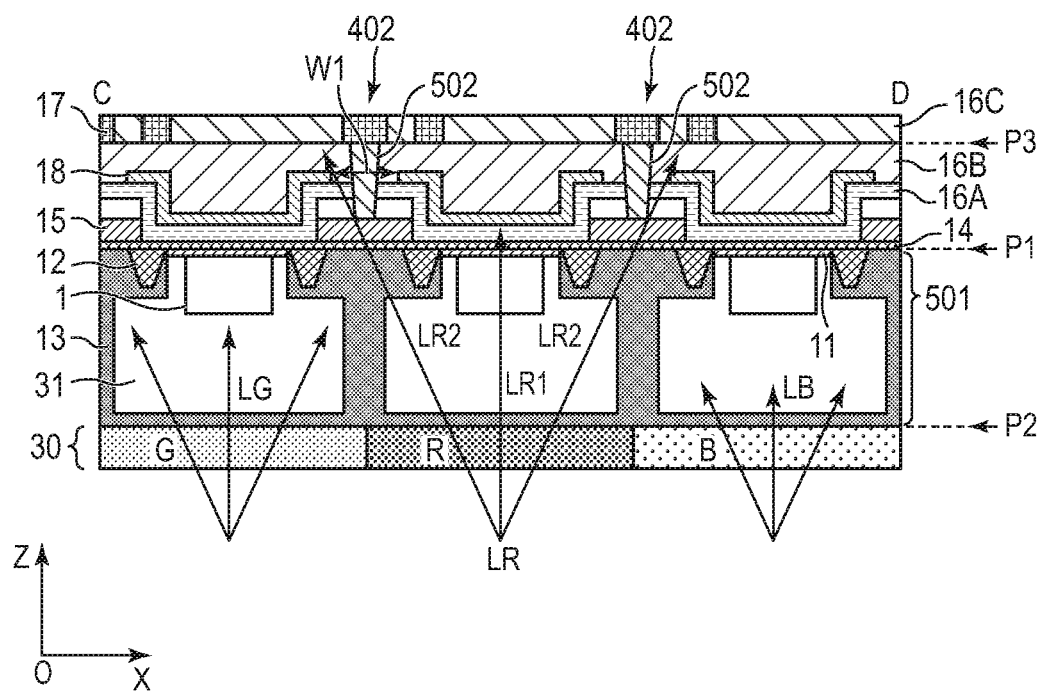
FIG. 5B is a schematic cross-sectional view for illustrating the photoelectric conversion apparatus according to Example 1.

FIG. 5A is a schematic cross-sectional view of the photoelectric conversion apparatus according to Example 1 taken along the line A-B in FIG. 4A. FIG. 5B is a schematic cross-sectional view of the photoelectric conversion apparatus according to Example 1 taken along the line C-D in FIG. 4A. For the sake of simplicity of the description, the following description is given on the assumption that the positive direction in the Z-axis is described as the upward direction.

A cross-sectional structure of the photoelectric conversion apparatus is described with reference to FIG. 5A and FIG. 5B. In FIG. 5A and FIG. 5B, three unit cells are arranged. The photoelectric conversion element 1 is provided to a semiconductor substrate 501. The semiconductor substrate 501 is made of, for example, single crystal silicon. In this case, the photoelectric conversion element 1 is assumed to indicate an N-type semiconductor region of a photodiode having a PN junction. The semiconductor substrate 501 has a plane P1 corresponding to a front plane and a plane P2 corresponding to a back plane. The isolation region 13 and the element isolation portion 12 are formed to the semiconductor substrate 501. The isolation region 13 is formed of a P-type semiconductor region for isolating the photoelectric conversion elements 1 from each other. The element isolation portion 12 can have STI or other such structure in which, for example, an insulator is formed in a trench. A semiconductor region 31 that also functions as a part of the photoelectric conversion element 1 is arranged in the semiconductor substrate 501. The semiconductor region 31 can be a P-type semiconductor region or an N-type semiconductor region having an impurity concentration lower than that of the N-type semiconductor region of the photoelectric conversion element 1. In the semiconductor substrate 501, a P-type semiconductor region 11 serving as a protective layer of the photoelectric conversion element 1 is formed on the plane P1 side of the photoelectric conversion element 1. Due to the semiconductor region 11, the photoelectric conversion element is a buried photodiode.

A charge fixing layer or other such film (not shown) is provided on the plane P2 side of the semiconductor substrate 501, and a color filter layer 30 is further provided. The color filter layer 30 includes red (R), blue (G), and green (G) color filters. The plurality of color filters have a Bayer color array. The color filter layer 30 is located between the plane P2 and a micro lens or other such optical element (not shown).

An insulating film 14 also serving as a gate insulating film is provided on the plane P1 side of the semiconductor substrate 501. On the insulating film 14, an insulating film 16A, the metal portion 18, an insulating film 16B, and an insulating film 16C are provided. In the cross section illustrated in FIG. 5B, a gate electrode 15 corresponding to the gate electrode 6 in FIG. 4A is provided between the insulating film 14 and the insulating film 16A. In Example 1, an insulator pattern having the same shape as that of the gate electrode 15 in a planar view is provided on the gate electrode 15, but the insulator pattern may not be provided. It is assumed that not only the gate electrode 6 illustrated in FIG. 4A but also other gate electrodes have the structure illustrated in the gate electrode 15.

A wiring layer 17 is provided to the insulating film 16C. The wiring layer 17 has a plurality of wiring patterns arranged at the same distance from the plane P1, and forms the control line 40 and the vertical signal line 10 illustrated in FIG. 1. A plane P3 includes the lower plane of the wiring layer 17. The wiring layer 17 is formed of a pattern made of copper or aluminum as a main component. In this case, the insulating films 14, 16A, 16B, and 16C can be made of, for example, silicon oxide, silicon nitride, silicon oxynitride, or other such material, and may be a single layer film or a laminated film. In particular, it is desired that the insulating film 14 and the insulating film 16A have such materials and film structures as to satisfy not only electrical characteristics and other such characteristics but also optical characteristics between the metal portion 18 and the semiconductor substrate 501, which are described later. A contact plug 502 forming the contact 306 is provided on the gate electrode 15.

The plane P3 includes the upper plane of the contact plug including the contact plug 502. The contact plug has a plane on the gate electrode side or the plane P1 side and a plane opposite to the lower plane. The plane on the gate electrode side or the plane P1 side is also referred to as "lower plane", and the plane opposite to the lower plane is also referred to as "upper plane".

At least a part of the metal portion 18 is located between the plane P1 and the plane P3. Further, at least a part of the metal portion 18 is located between the plane P1 and a plane including the upper plane of the gate electrode 15. The metal portion 18 has the opening 402. The opening has a width W1 along a certain direction, in this case, the X direction. The metal portion 18 can be formed through use of a material having a predetermined reflectance including, for example, aluminum, titanium, titanium nitride, tungsten, cobalt, any one of various silicides, or other such metal or metal compound. The metal portion 18 is a single layer film or a multilayer film. The multilayer film may be a two-layer film made of different materials, or may be a two-layer film made of the same material as a main component by different manufacturing methods. In Example 1, the metal portion 18 is assumed to be formed of a film made of at least one layer of tungsten as a main component.

Figure 6:
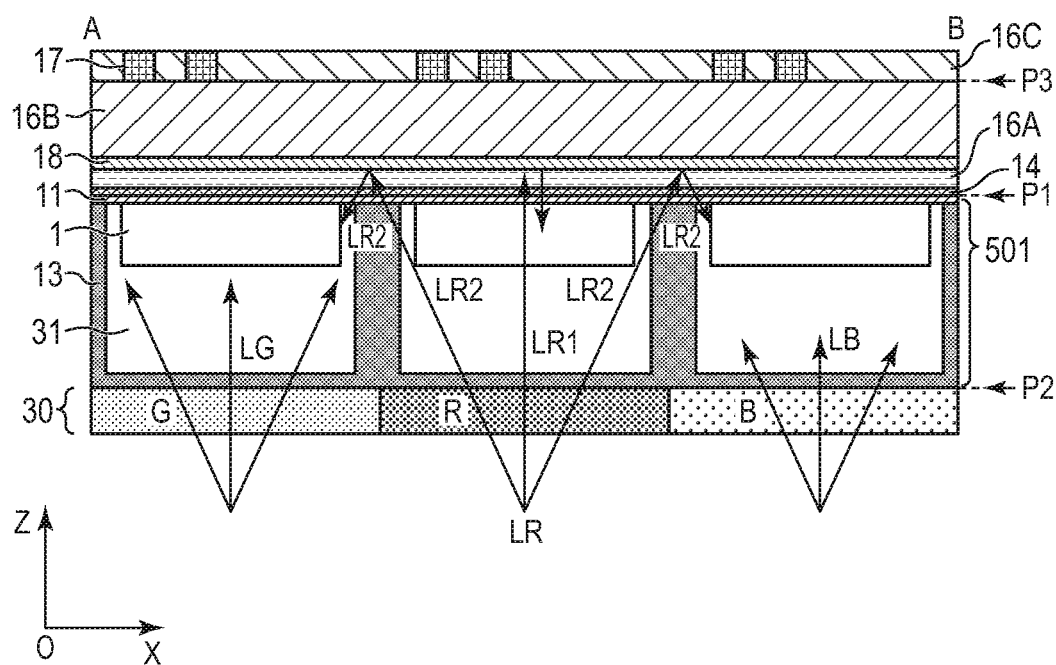
FIG. 6 is a schematic cross-sectional view for illustrating the photoelectric conversion apparatus according to Example 1.

In the photoelectric conversion apparatus according to Example 1, light enters through the plane P2. In FIG. 5A and FIG. 5B, the incident light is indicated by light beams LG, LR, and LB. The light beam LG indicates light passing through a green color filter, the light beam LR indicates light passing through a red color filter, and the light beam LB indicates light passing through a blue color filter. Of those light beams, the light beam LR that is less absorbed by silicon reaches the plane P1. Of the light beams LR, a light beam LR1 that has entered perpendicularly to the plane P2 is reflected by the metal portion 18, and can be detected by the photoelectric conversion element 1. Of the light beams LR, a light beam LR2 that has entered obliquely with respect to the plane P2 passes through the opening 402 of the metal portion 18. FIG. 6 is a schematic cross-sectional view of a photoelectric conversion apparatus according to a comparative example.

FIG. 6 is a drawing corresponding to FIG. 5A, and is different in that there is no opening 402 in the metal portion 18. Due to the absence of the opening 402, as illustrated in FIG. 6, the light beam LR2 is reflected by the metal portion 18 to enter the photoelectric conversion element 1 corresponding to another color. Therefore, the structure illustrated in FIG. 5A and FIG. 5B can cause the light beam LR2 that has obliquely entered to less often enter another photoelectric conversion element. The photoelectric conversion apparatus according to Example 1 includes the color filter layer 30, and hence the entrance of stray light to another photoelectric conversion element can cause color mixture, reduction in resolution, or a false signal. Even in the case of a monochrome photoelectric conversion apparatus that does not have the color filter layer 30, the entrance of stray light can cause reduction in resolution or a false signal. In FIG. 5A and FIG. 5B, the light beam LR2 that has passed through the opening 402 is further caused to less often enter the plane P1 again due to the presence of the metal portion 18.

The metal portion 18 is preferred to be arranged at a fixed distance from the center of gravity of the photoelectric conversion element 1. In this case, the center of gravity of the photoelectric conversion element 1 is a point determined by, for example, the center of the photoelectric conversion element 1 or the optical design of the photoelectric conversion apparatus. In FIG. 4A, a point 400 is assumed to be the center of gravity. The metal portion 18 is preferred to have a point-symmetric shape with respect to the point 400, and may have, for example, a circular shape or a square shape. The metal portion 18 of each unit cell may be separated, that is, one metal portion 18 may be provided for each unit cell. As in Example 1, the metal portion 18 may have a shape in which a part located above one unit cell and a part located above another unit cell are connected to each other at least partially. In the case of the metal portion 18 in Example 1, when a voltage is supplied to the metal portion 18, the voltage can be supplied to the metal portion 18 at a freely-set position, for example, outside a unit cell region. It is not required to provide a wire for supplying a voltage. A part in which a part of the metal portion 18 located above one unit cell is connected to a part of the metal portion 18 located above another unit cell is preferred to be a part in which no transistor of each unit cell is provided or a part to which a power supply voltage is supplied. The part to which a power supply voltage is supplied is often provided at a position spaced apart from an optical axis because electric charges generated through photoelectric conversion are discharged. Therefore, even when the metal portion 18 is provided, an influence exerted on the stray light is small. Meanwhile, a fixed voltage is supplied to the part to which a power supply voltage is supplied, and hence the potential of the metal portion 18 hardly fluctuates. When the potential of the metal portion 18 fluctuates, the fluctuation is transmitted to another wire that can form a parasitic capacitance with the metal portion 18, and hence the fluctuation is transmitted to the signal. Therefore, the connection part of the metal portion 18 is preferred to be provided in the part in which no transistor is provided or the part to which a power supply voltage is supplied.

As described above, an increase in capacitance of an FU can be suppressed by the photoelectric conversion apparatus described in Example 1. In addition, the mixing of stray light can be reduced by the photoelectric conversion apparatus described in Example 1.

Second Example

Figure 7A:
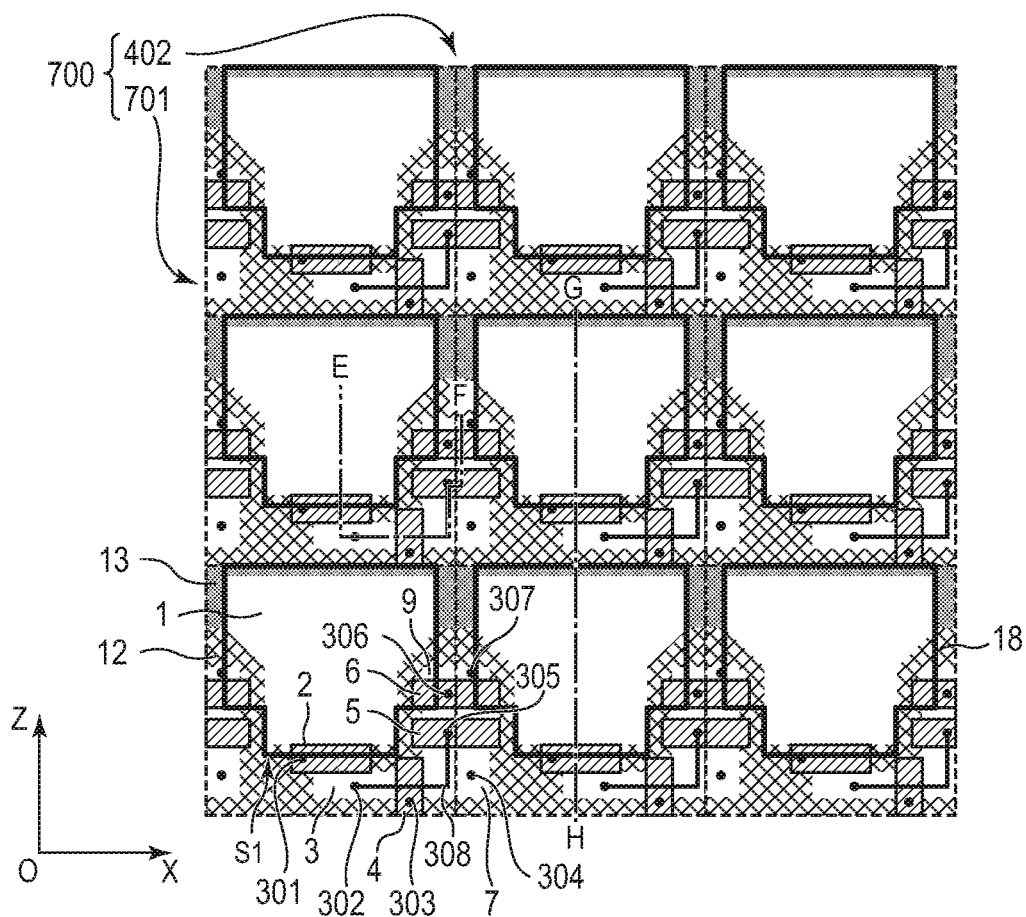
FIG. 7A is a schematic planar view for illustrating a photoelectric conversion apparatus according to Example 2 of the disclosure.

A photoelectric conversion apparatus according to Example 2 of the present disclosure and a manufacturing method therefor are described with reference to FIG. 7A, FIG. 7B, FIG. 8A to FIG. 8C, and FIG. 9A to FIG. 9C. FIG. 7A is a schematic planar view for illustrating the photoelectric conversion apparatus according to Example 2. The schematic planar view of FIG. 7A is similar to those of FIG. 3 and FIG. 4A, and the same components are denoted by the same reference symbols, and have their descriptions omitted. FIG. 7A is different from FIG. 4A for Example 1 in that the metal portion 18 is independently provided for each unit cell. The metal portion 18 has an opening 701 along the X direction in addition to the opening 402 along the Y direction. In this case, the opening 402 and the opening 701 are integrated. That is, the metal portion 18 has a lattice-like opening 700. In addition, the metal portion 18 is provided on the photoelectric conversion element 1 side above the gate electrode 2 of the transfer transistor, but is not provided on the FD side. The side plane S1 of the metal portion 18, which forms the opening 701, is located above the gate electrode 2. In Example 2 as well, at least a part of the wire 308 is superimposed over the opening 700. It can also be recognized that the entirety of the wire 308 is superimposed over the opening 700, and that the opening 700 encloses the wire 308. It is preferred that the opening 701 be superimposed over at least a part of the FD 3. In Example 2, the opening 701 is superimposed over the entirety of the FD 3. It can also be recognized that the opening 701 encloses the FD 3. The opening 402 in Example 2 has a width wider than that of the opening illustrated in FIG. 4A, and is superimposed over the entirety of the gate electrode 5. That is, the opening 402 encloses the gate electrode 5. An increase in capacitance relating to the FD 3 can be suppressed by such an opening 700.

Figure 7B:
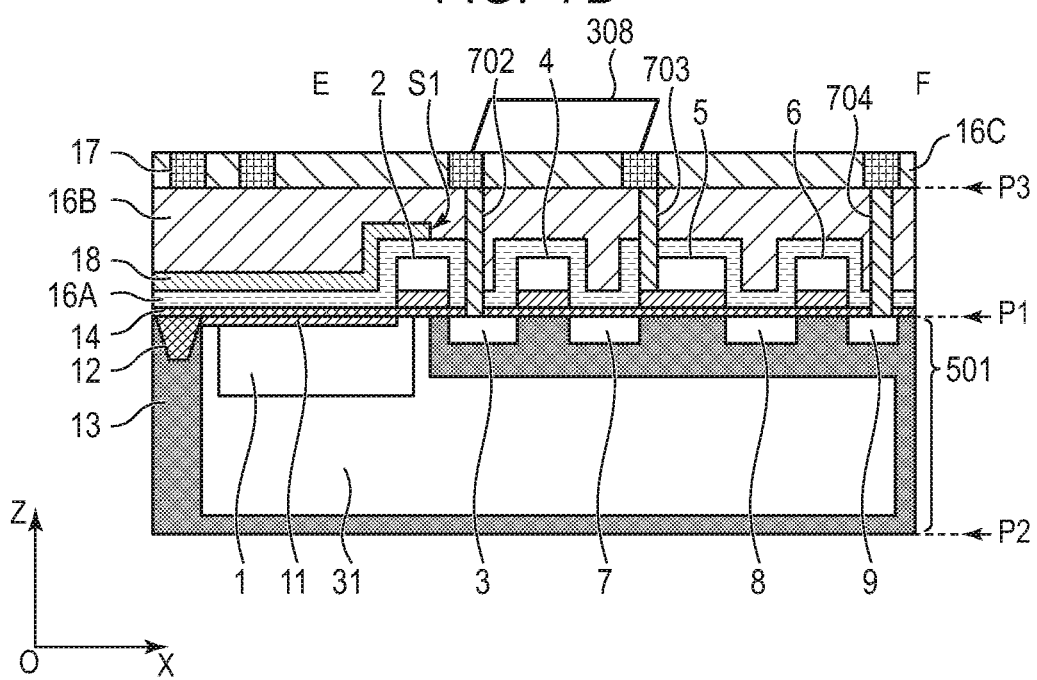
FIG. 7B is a schematic cross-sectional view for illustrating the photoelectric conversion apparatus according to Example 2.

FIG. 7B is a schematic cross-sectional view for illustrating a cross section of the photoelectric conversion apparatus taken along the line E-F in FIG. 7A. As described with reference to FIG. 7A, the side plane S1 of the metal portion 18 is located above the gate electrode 2. In FIG. 7B, the wire 308, a contact plug 702 serving as the contact 302 connected to the FD 3, and a contact plug 703 serving as the contact 305 connected to the gate electrode 5 are illustrated. The wire 308 includes a first part connected to the contact plug 702, a second part connected to the contact plug 703, and a third part extending from the first part to the second part to connect the first part and the second part. In a planar view, the first part is a part superimposed over the contact plug 702. In the same manner, the second part is a part superimposed over the contact plug 703. In this case, the metal portion 18 is not provided under at least a part of the wire 308, in particular, under at least a part of the third part. That is, the metal portion 18 has an opening over which at least a part of the wire 308 or at least a part of the third part is superimposed. Therefore, an increase in capacitance relating to the FD 3 can be suppressed. In addition, in the structure illustrated in FIG. 7B, the metal portion 18 is not provided above the FD 3. That is, the metal portion 18 has an opening superimposed over the FD 3. Therefore, an increase in capacitance relating to the FD 3 can be suppressed. The metal portion 18 is also spaced apart from the contact plug 702 connected to the FD 3, and hence the capacitance relating to the FD 3 can be further reduced.

The metal portion 18 is located at least between a plane including the upper plane of the insulator provided above the gate electrode 2 and the plane P1 when viewed in a cross section, and extends from a part of the gate electrode 2 to the photoelectric conversion element 1 when viewed in a planar view. The metal portion 18 may also be located between a plane including the upper plane of the gate electrode 2 and the plane P1 when viewed in a cross section. A contact plug 704 forms the contact 307. Even with such a structure, it is possible to reduce the mixing of stray light. It is also possible to reduce the capacitance relating to the FD 3.

In this case, the capacitance relating to the FD 3 is determined by the sum of the capacitance of the FD 3 and the parasitic capacitance of the FD 3. The parasitic capacitance of the FD 3 includes, for example, a fringe capacitance between the semiconductor region of the FD 3 and the gate electrode 2 of the transfer transistor and an interwire capacitance between a wire electrically connected to the FD 3 and a wire of another potential. When the metal portion 18 is arranged above the FD 3 and the gate electrode 5 of the amplifying transistor, a parasitic capacitance is generated between the semiconductor region of the FD 3 and the metal portion 18 and between the gate electrode 5 of the amplifying transistor and the metal portion 18. When the parasitic capacitance of the FD 3 is large, the gain is low, and the charge-voltage conversion efficiency at the node of the FD 3 is low, which lowers the signal level. In particular, when an incident light amount is small, the influence of noise increases, thereby degrading image quality. Meanwhile, when the parasitic capacitance of the FD 3 is small, the capacitance relating to the FD 3 is small, and hence the gain is high. Therefore, even when the incident light amount is small, the signal level increases, to thereby be able to reduce the influence of noise. In the photoelectric conversion apparatus according to Example 2, the metal portion 18 is not arranged above the FD 3 and the gate electrode 5 of the amplifying transistor. That is, the parasitic capacitance of the FD 3 can be further reduced as compared with Example 1. Therefore, with the photoelectric conversion apparatus according to Example 2, the image quality can be further improved compared with Example 1.

Figure 8A:
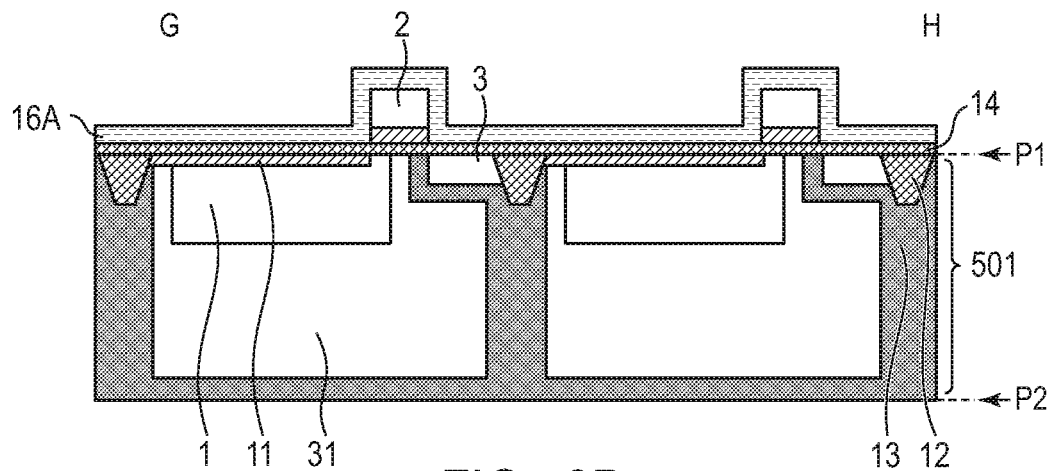
FIG. 8A, FIG. 8B, and FIG. 8C are schematic cross-sectional views for illustrating a manufacturing method for the photoelectric conversion apparatus according to Example 2.

A manufacturing method for the photoelectric conversion apparatus according to Example 2 is described with reference to FIG. 8A to FIG. 8C and FIG. 9A to FIG. 9C. FIG. 8A to FIG. 8C and FIG. 9A to FIG. 9C are schematic cross-sectional views for illustrating a cross section of the photoelectric conversion apparatus taken along the line G-H line in FIG. 7A. In FIG. 8A to FIG. 8C and FIG. 9A to FIG. 9C, components that have not been subjected to processes may be denoted by the same reference symbols as those that have been subjected to processes. In FIG. 8A, the semiconductor substrate 501 is provided. The semiconductor substrate 501 includes the element isolation portion 12, the photoelectric conversion element 1, a semiconductor region 3, the semiconductor region 11, the semiconductor region 31, the isolation region 13, the insulating film 14, and the gate electrode 2. The element isolation portion 12, the semiconductor regions, and the insulating film are formed by a semiconductor process. In this case, the insulating film 16A is provided above the plane P1 so as to cover the gate electrode 2. The insulating film 16A is formed by a plasma CVD method or other such method, and is made of, for example, a material including silicon and at least one of oxygen and nitrogen.

Figure 8B:
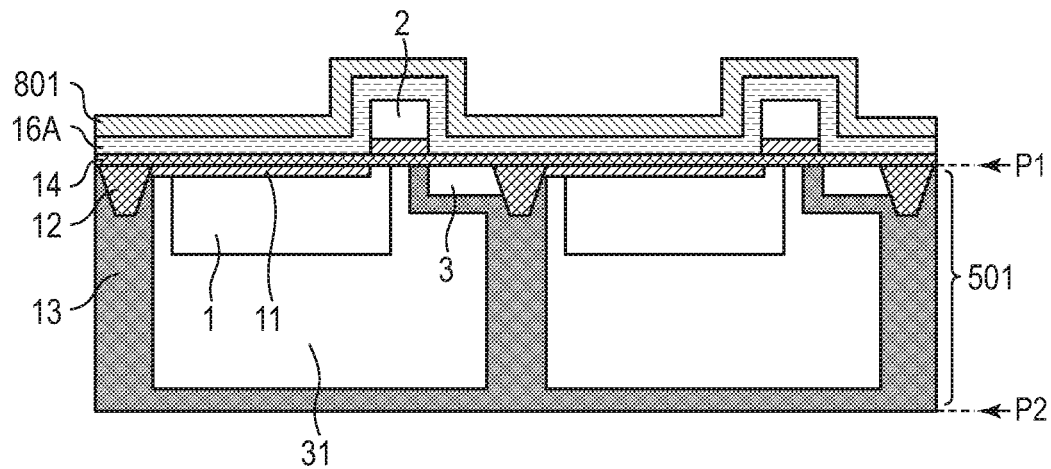
Figure 8C:
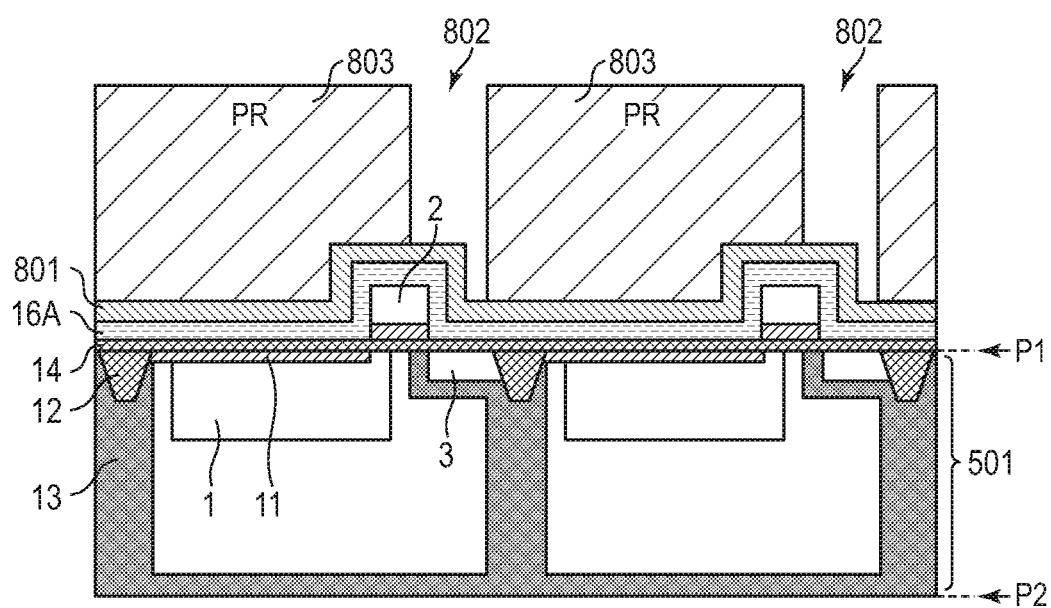

In FIG. 8B, a reflective material film 801 is formed above the plane P1 of the semiconductor substrate 501. The reflective material film 801 is a film that later becomes the metal portion 18. The reflective material film 801 is formed through use of a sputtering method, a CVD method, or other such method, and is made of the above-mentioned material having a predetermined reflectance including tungsten or other such material. In FIG. 8C, a photoresist pattern 803 is formed on the reflective material film 801. The photoresist pattern 803 has an opening 802. Etching is performed with the photoresist pattern 803 being used as a mask to remove a part of the reflective material film 801. The etching can be performed by an RIE method or other such freely-selected method. A structure illustrated in FIG. 9A can be obtained by removing a part of the reflective material film 801 and then removing the photoresist pattern 803. In this case, the metal portion 18 extends from above the photoelectric conversion element 1 to above the gate electrode 2, and the side plane S1 is located above the gate electrode 2. When another side plane of the metal portion 18 is set as the side plane S2, it can be recognized that the opening 701 is formed by the side plane S1 of the metal portion 18 and the side plane S2 of the metal portion 18 of another unit cell.

Subsequently, as illustrated in FIG. 9B, the insulating film 16B is formed to cover the metal portion 18, and the contact plug 702 is formed in the insulating film 16B. The insulating film 16B is formed by a plasma CVD method or other such method, and is subjected to a planarization process by a CMP method or other such method as the requirement arises. The contact plug 702 is provided to a contact hole formed in the insulating film 16B, and is formed by filling the contact hole with titanium nitride, tungsten, or other such metal. The upper plane of the contact plug 702 and the upper plane of the insulating film 16B form the same plane P3. Then, as illustrated in FIG. 9C, the insulating film 16C and the wiring layer 17 are formed on the plane P3. After that, an insulating film, a via plug, and a wiring layer are formed. Then, a process for thinning the semiconductor substrate 501 is performed, and the plane P2 is formed. For example, an insulating film and a color filter layer are formed on the plane P2 side, to thereby complete the photoelectric conversion apparatus.

As described above, with the photoelectric conversion apparatus according to Example 2, it is also possible to achieve at least one of reduction of the mixing of stray light and reduction of the FD capacitance.

Third Example

Figure 10:
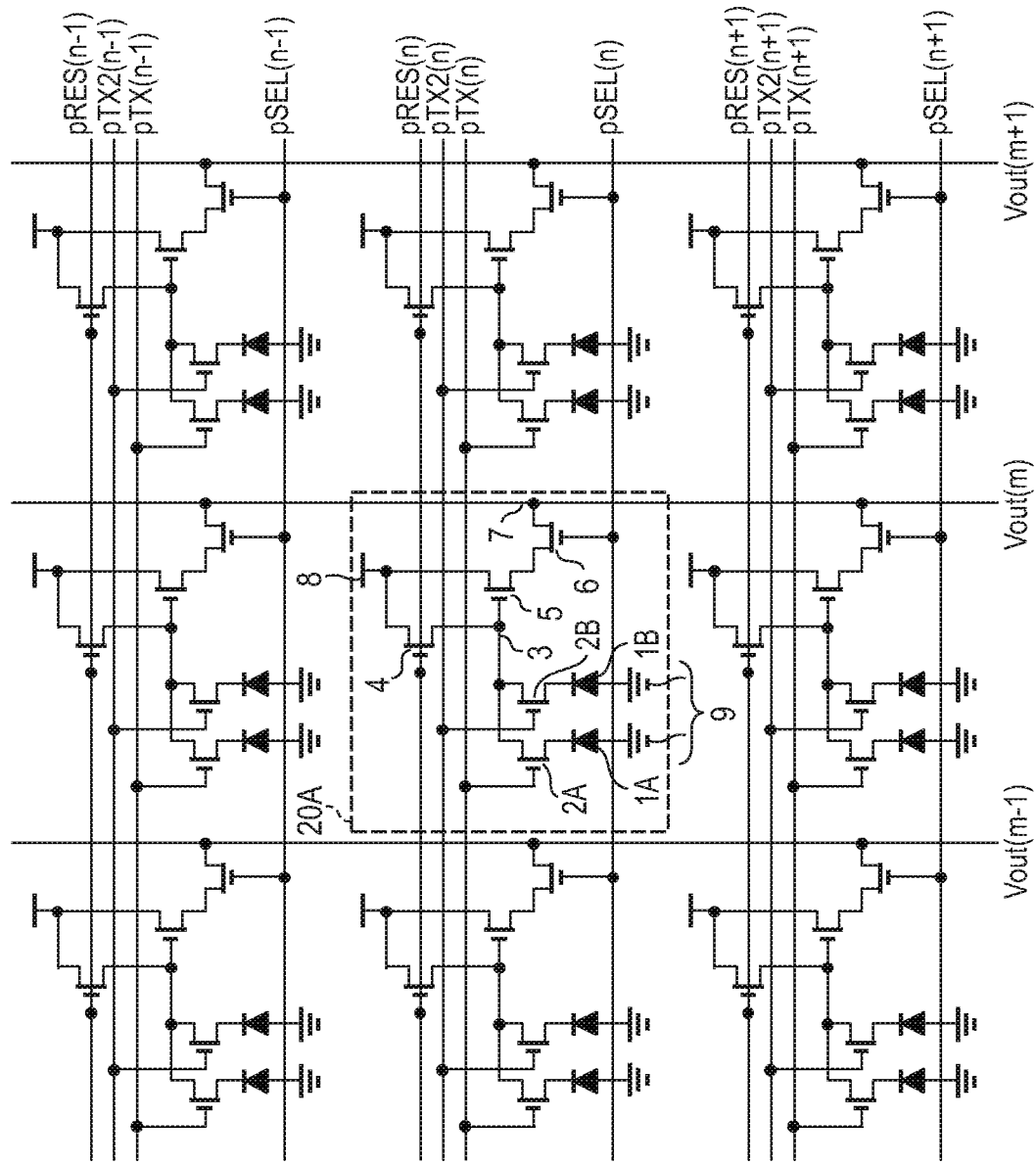
FIG. 10 is a circuit diagram for illustrating a photoelectric conversion apparatus according to Example 3 of the disclosure.

A photoelectric conversion apparatus according to Example 3 of the present disclosure is described with reference to FIG. 10, FIG. 11A, FIG. 11B, and FIG. 12. FIG. 10 is a circuit diagram for illustrating the photoelectric conversion apparatus according to Example 3. FIG. 10 is a drawing corresponding to FIG. 2 for Example 1 and Example 2. FIG. 10 is different in that the unit cell 20 illustrated in FIG. 2 is replaced by a unit cell 20A, and the other configuration is the same as that illustrated in FIG. 2. The unit cell 20A illustrated in FIG. 10 differs from the unit cell 20 illustrated in FIG. 2 in the number of photoelectric conversion elements and the number of transfer transistors. Each of a plurality of unit cells 20A includes two photoelectric conversion elements 1A and 1B and two transfer transistors 2A and 2B. Each of the plurality of unit cells 20A also includes the FD 3, the reset transistor 4, the amplifying transistor 5, and the selection transistor 6. In the photoelectric conversion apparatus according to Example 3, for example, one micro lens is provided for one of the unit cells 20A, and a phase difference signal can be detected through use of two photoelectric conversion elements to perform focus detection.

Figure 11A:
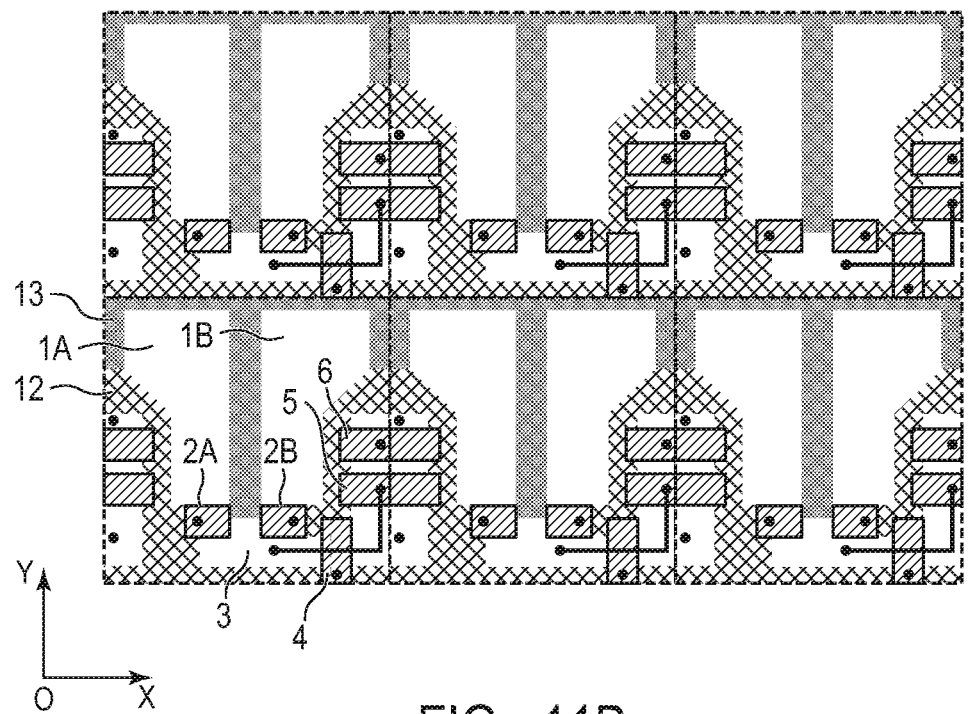
FIG. 11A is a schematic planar view for illustrating the photoelectric conversion apparatus according to Example 3.

FIG. 11A is a schematic planar view for illustrating the unit cells 20A corresponding to two rows and three columns (2×3 unit cells 20A) in FIG. 10. In FIG. 11A, which is a drawing corresponding to FIG. 3, a structure excluding a metal portion is illustrated for better understanding. The photoelectric conversion element 1A and the photoelectric conversion element 1B are arranged adjacently to each other along the X direction. The transfer transistor 2A and the transfer transistor 2B are also arranged adjacently along the X direction. The transfer transistor 2A is located between the photoelectric conversion element 1A and the FD 3, and the transfer transistor 2B is located between the photoelectric conversion element 1B and the FD 3. The isolation region 13 extends along the Y direction between the photoelectric conversion element 1A and the photoelectric conversion element 1B and between the gate electrodes 2A and 2B of the transfer transistor. The other structure and the other plan layout that are illustrated in FIG. 11A are the same as those illustrated in FIG. 3, and hence their reference symbols and descriptions are omitted. In the X direction, the isolation region 13 between the photoelectric conversion element 1A and the photoelectric conversion element 1B has a width W4.

Figure 11B:
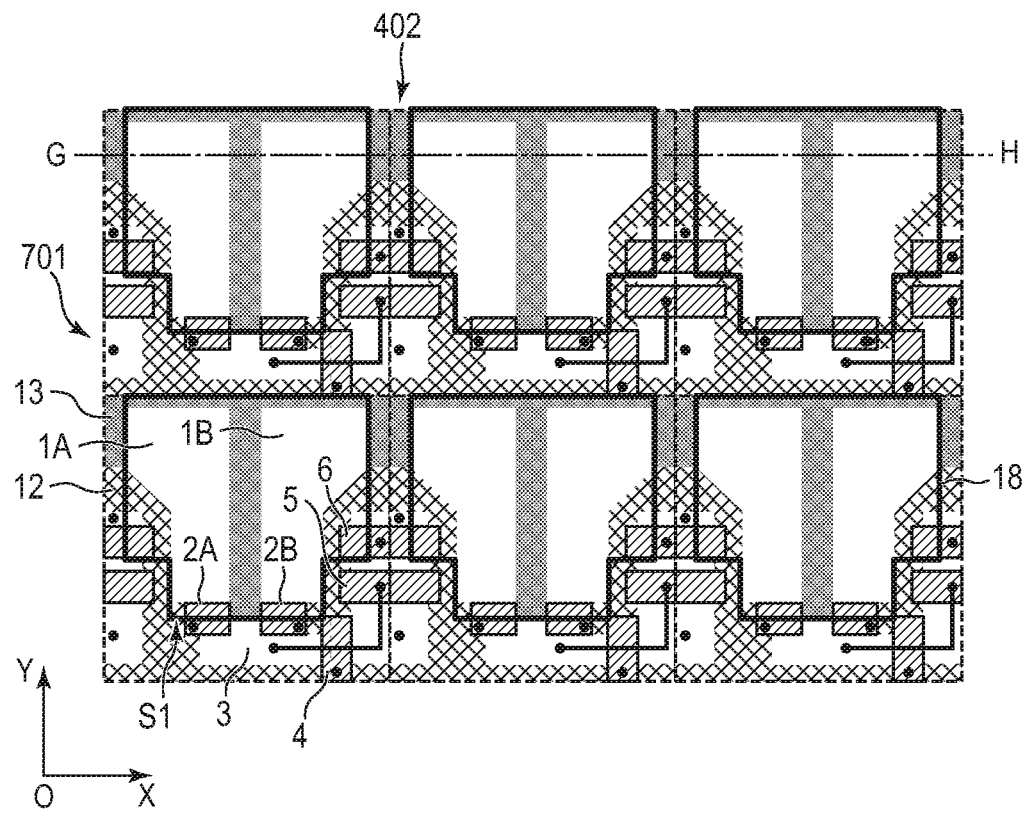
FIG. 11B is a schematic planar view for illustrating the photoelectric conversion apparatus according to Example 3.

FIG. 11B is a schematic planar view for illustrating the photoelectric conversion apparatus according to Example 3. FIG. 11B is a plan layout view in which the metal portion 18 is overlaid on the structure illustrated in FIG. 11A. One metal portion 18 is provided for one unit cell 20A. That is, the metal portion 18 has the opening 402 between a given unit cell 20A and another unit cell 20A adjacent to the given unit cell 20A in the X direction, and has the opening 701 between a given unit cell 20A and another unit cell 20A adjacent to the given unit cell 20A in the Y direction. With such a structure, the color mixture and the mixing of stray light are reduced in the photoelectric conversion apparatus according to Example 3 as well. In addition, the side plane S1 forming the opening 701 of the metal portion 18 is located above the gate electrodes 2A and 2B. With such a structure, due to the absence of the metal portion 18 above the FD 3, an increase in capacitance of the FD 3 can be suppressed.

Figure 12:
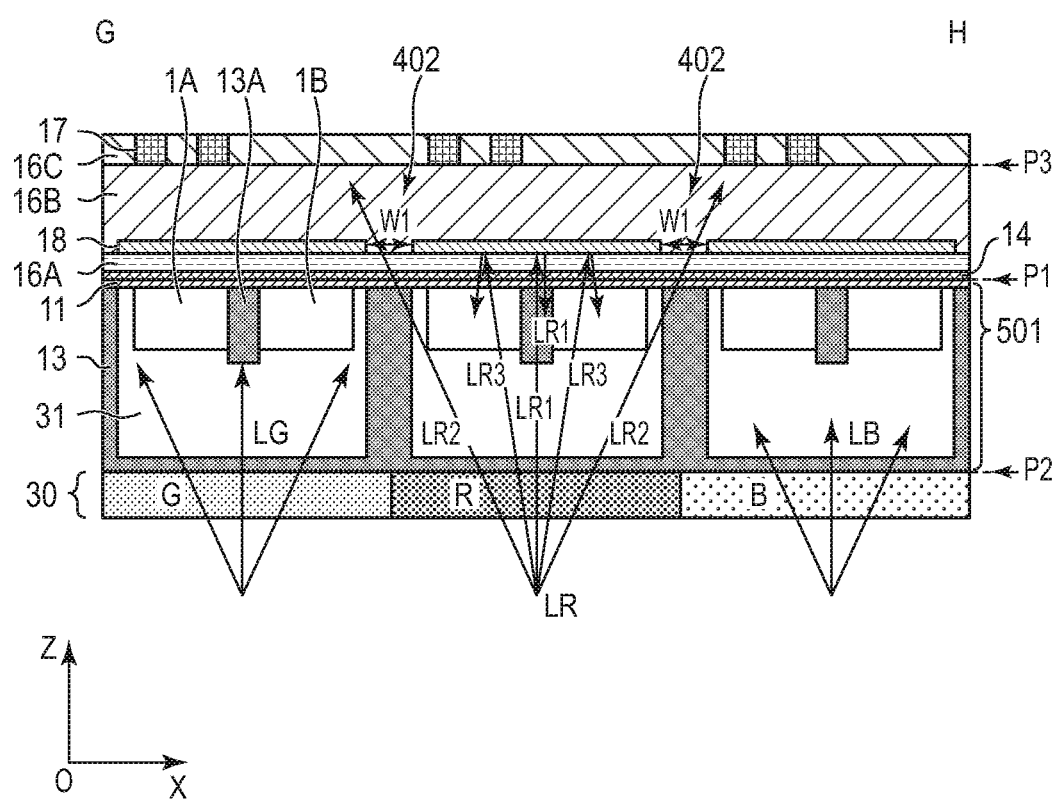
FIG. 12 is a schematic cross-sectional view for illustrating the photoelectric conversion apparatus according to Example 3.

FIG. 12 is a schematic cross-sectional view of the photoelectric conversion apparatus taken along the line G-H in FIG. 11B. FIG. 12 is a drawing corresponding to FIG. 5A for Example 1. In FIG. 12, an isolation region 13A being a P-type semiconductor region is located between the photoelectric conversion element 1A and the photoelectric conversion element 1B that indicate N-type semiconductor regions. The isolation region 13A extends from the plane P1 to the plane P2 side across the bottom planes of the photoelectric conversion elements 1A and 1B, but the semiconductor region 31 is formed between the isolation region 13A and the plane P2. With such a structure, light that has entered between the isolation region 13A and the plane P2 can also be detected as a signal. As illustrated in FIG. 12, the metal portion 18 extends from above the photoelectric conversion element 1A to above the photoelectric conversion element 1B over the isolation region 13A. The behavior of incident light in such a structure is described in the same manner as in FIG. 5A. Of the light beams LR, the light beam LR1 that has entered perpendicularly to the plane P2 is reflected by the metal portion 18, and can be detected by the photoelectric conversion element 1. Of the light beams LR, a light beam LR3 that has obliquely entered is reflected by the metal portion 18 to enter each corresponding one of the photoelectric conversion elements 1A and 1B. Of the light beams LR, an obliquely incident light beam LR2 that has entered at a larger angle of incidence obliquely with respect to the plane P2 than those of the light beams LR1 and LR3 passes through the opening 402 of the metal portion 18. With such a structure, it is possible to reduce the mixing of stray light.

When a phase difference signal is detected, it is desired that the two photoelectric conversion elements 1A and 1B be arranged in a line-symmetric or point-symmetric shape or arrangement with respect to each other. It is desired that the metal portion 18 have a shape or arrangement that is line-symmetric or point-symmetric with respect to the median point of the two photoelectric conversion elements 1A and 1B, and the side planes forming the end portions of the metal portion 18 be located at the same distance from the median point. In the case of using four photoelectric conversion elements, their shapes and arrangement are desired to be point-symmetric with respect to each other. In the same manner, it is desired that the metal portion 18 also have a point-symmetric shape and arrangement with respect to the median point of the photoelectric conversion elements.

Fourth Example

Figure 13A:
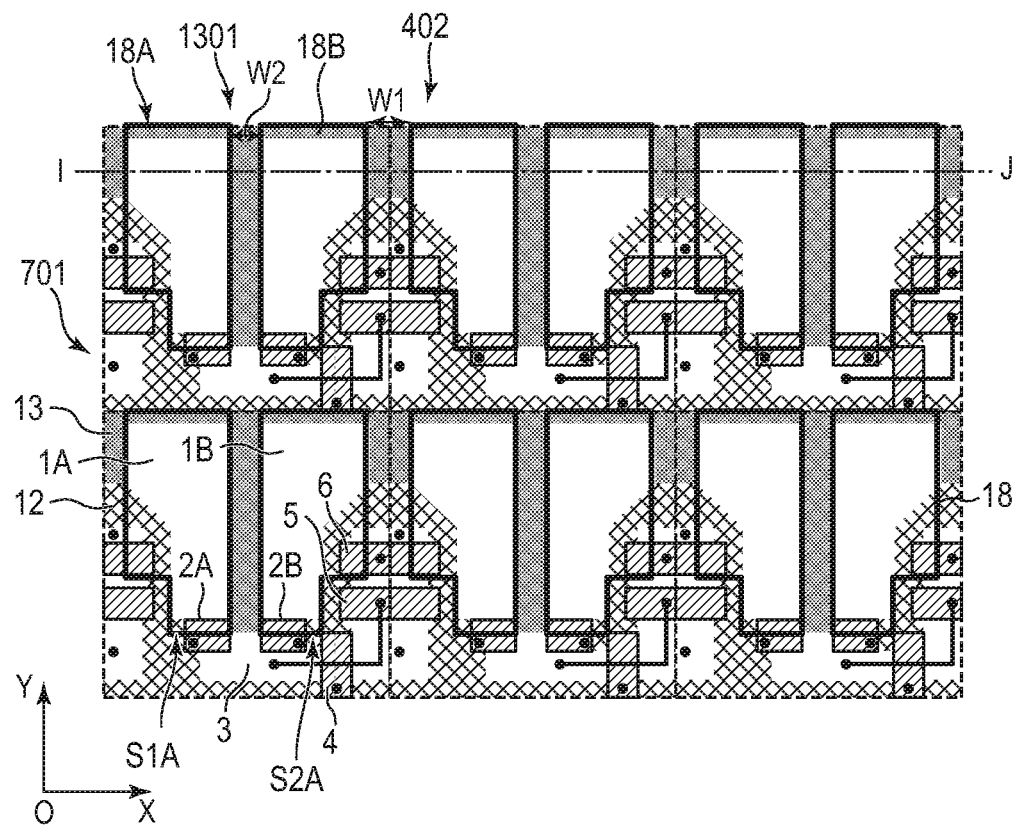
FIG. 13A is a schematic planar view for illustrating a photoelectric conversion apparatus according to Example 4 of the disclosure.

A photoelectric conversion apparatus according to Example 4 of the present disclosure is described with reference to FIG. 13A and FIG. 13B. Example 4 is different from Example 3 in the structure of the metal portion 18; two metal portions 18A and 18B are provided for the unit cell 20A. FIG. 13A is a diagram corresponding to FIG. 11B, in which the metal portions 18A and 18B in Example 4 are provided in addition to the components of FIG. 11A. The other structure and the other plan layout that are illustrated in FIG. 13A are the same as those illustrated in FIG. 3, and hence their reference symbols and descriptions are omitted.

The metal portion 18A is provided above the photoelectric conversion element 1A, and the metal portion 18B is provided above the photoelectric conversion element 1B. A side plane S1A of the metal portion 18A is located above the gate electrode 2A, and a side plane S2A of the metal portion 18B is located above the gate electrode 2B. It can also be recognized that the metal portions 18A and 18B have an opening 1301 in addition to the opening 402 and the opening 701. The opening 1301 is located above between the two photoelectric conversion elements 1A and 1B, that is, above the isolation region 13A, and has a width W2. In a planar view, the opening 1301 exposes at least a part of the isolation region 13A. The opening 1301 extends to a part between the two gate electrodes 2A and 2B while maintaining the width W2. In this case, the width W1 and the width W2 satisfy the relationship of W1>W2. The width W1 in the unit cell 20A is about 0.1 µm to about 0.2 µm, and the width W2 is about 0.03 µm to about 0.15 µm. The width W1 is about 1.5 times to about 3 times as large as the width W2. When the relationship between the width of the opening and the width of the isolation region 13A is (width W1)>(width W3) and (width W2)>(width W4), it is possible to further reduce the mixing of stray light.

Figure 13B:
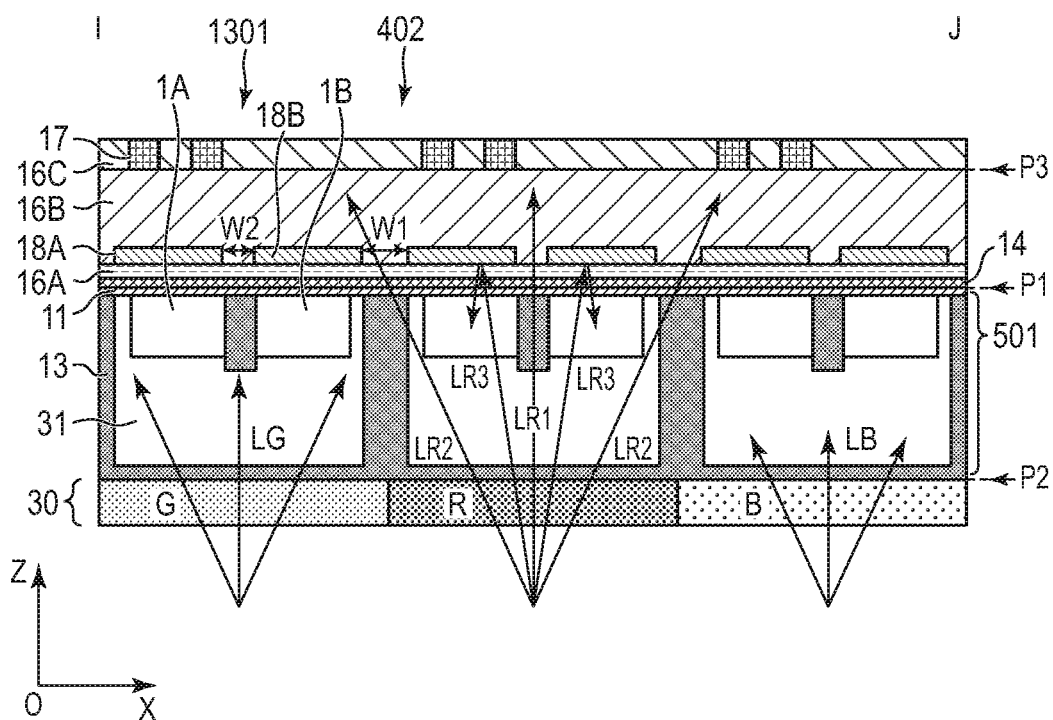
FIG. 13B is a schematic cross-sectional view for illustrating the photoelectric conversion apparatus according to Example 4.

FIG. 13B is a schematic cross-sectional view of the photoelectric conversion apparatus taken along the line I-J in FIG. 13A. FIG. 13B is a drawing corresponding to FIG. 12. As illustrated in FIG. 13B, the opening 1301 is formed between the metal portions 18A and 18B, and hence, of the light beams LR, the light beam LR1 that has entered perpendicularly to the plane P2 passes through the opening 1301.

Now, a general focus detection operation is described. When detecting a phase difference signal to perform the focus detection, a defocus amount is calculated from the signal based on a signal electron generated by the photoelectric conversion element 1A and the signal based on a signal charge generated by the photoelectric conversion element 1B. More specifically, a positional relationship between the signal received from the photoelectric conversion element 1A and the signal received from the photoelectric conversion element 1B is relatively shifted to calculate a correlation amount indicating a matching degree of the signals, and an image shift amount is detected from the amount of the shift. To generate this image shift amount, it is required to accurately isolate the signal received from the photoelectric conversion element 1A and the signal received from the photoelectric conversion element 1B from each other. That is, it is possible to improve the accuracy of the focus detection by accurately isolating the signal received from the photoelectric conversion element 1A and the signal received from the photoelectric conversion element 1B from each other.

In this case, in FIG. 12 for Example 3, the light beam LR1 is reflected by the metal portion 18 to return toward the plane P2. The reflected light beam LR1 is photoelectrically converted by the isolation region 13A, and the photoelectrically converted electrons are accumulated in the photoelectric conversion element 1A or the photoelectric conversion element 1B. It is likely to depend on, for example, the voltage states of the two photoelectric conversion elements 1A and 1B and the variations and roughness of a reflection plane ascribable to the manufacturing of the metal portion 18, which one of the photoelectric conversion elements 1A and 1B the electrons photoelectrically converted in the vicinity of the isolation region 13A are accumulated in. That is, the electron photoelectrically converted by the reflected light beam LR1 contributes to the sensitivity of the unit cell 20A, but tends to become a component that degrades isolation performance in terms of the point of isolating the signals received from the photoelectric conversion elements 1A and 1B from each other, which is a so-called false signal. Meanwhile, according to the structure of FIG. 13B for Example 4, the opening 1301 between the metal portions 18A and 18B is located above the isolation region 13A, to thereby allow the transmission of the light beam LR1. Therefore, the accuracy of the focus detection can be improved.

The configuration of Example 3 and the configuration of Example 4 can be appropriately selected depending on which one of the characteristics of focus detection accuracy and sensitivity is to be further improved. It is also possible to expect improvement in sensitivity by, for example, reducing the width W2 of the opening 1301 in Example 4 or reducing the length (in a direction perpendicular to the width direction) of the opening 1301.

With such a structure of the metal portion, it is possible to reduce the mixing of stray light while suppressing an increase in capacitance of the FD 3. The opening 1301 is formed so as to isolate the metal portion 18A and the metal portion 18B from each other, but may be formed so that a part of the metal portion 18A and a part of the metal portion 18B are connected to each other. In that case, a voltage can easily be supplied to the metal portions 18A and 18B.

Fifth Example

Figure 14:
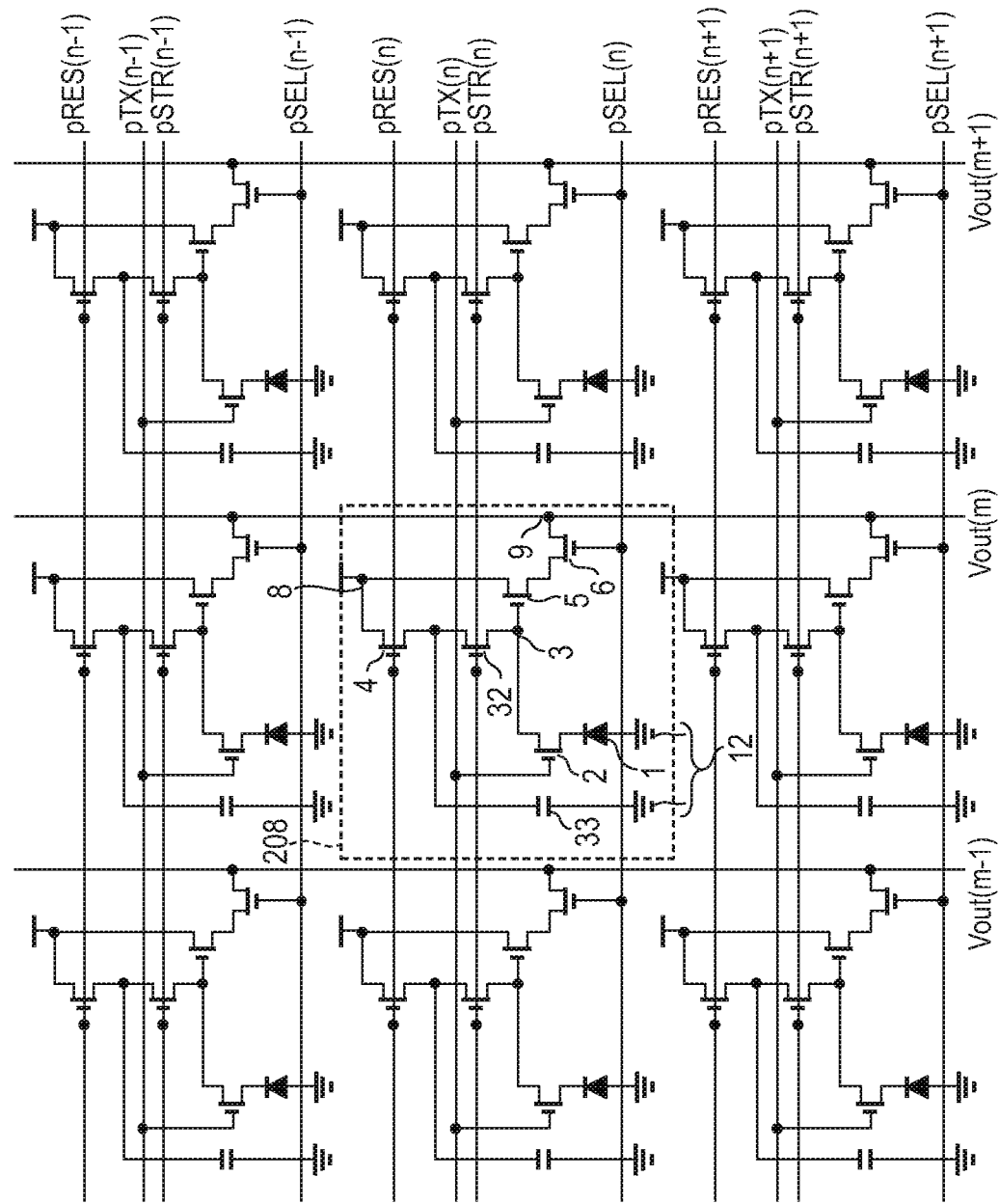
FIG. 14 is a circuit diagram for illustrating a photoelectric conversion apparatus according to Example 5 of the disclosure.
Figure 15A:
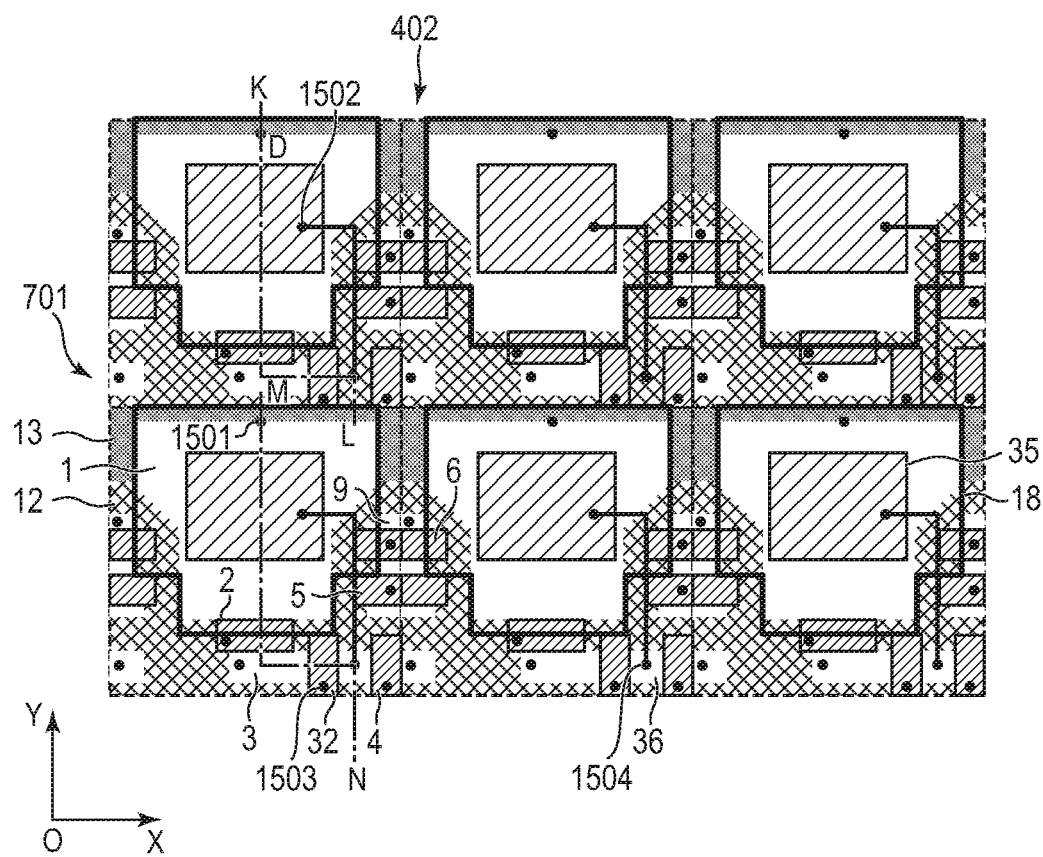
FIG. 15A is a schematic planar view for illustrating the photoelectric conversion apparatus according to Example 5.

A photoelectric conversion apparatus according to Example 5 of the present disclosure is described with reference to FIG. 14, FIG. 15A, and FIG. 15B. FIG. 14 is a circuit diagram for illustrating the photoelectric conversion apparatus according to the Example 5 in comparison with Example 1. FIG. 14 is a diagram corresponding to FIG. 2 for Example 1 and Example 2. FIG. 14 is different in that the unit cell 20 illustrated in FIG. 2 is replaced by a unit cell 20B, and the other configuration is the same as that illustrated in FIG. 2. The unit cell 20B illustrated in FIG. 14 is obtained by adding one capacitor 33 and a capacitance addition transistor 32 to the unit cell 20 illustrated in FIG. 2. Each of a plurality of unit cells 20B includes the photoelectric conversion element 1, the transfer transistor 2, the FD 3, the reset transistor 4, the amplifying transistor 5, the selection transistor 6, the capacitor 33, and the capacitance addition transistor 32. The capacitance addition transistor 32 is a switch, and is provided between the reset transistor 4 and the FD 3 to control conduction between the reset transistor 4 and the FD 3. The capacitor 33 is provided between the capacitance addition transistor 32 and the reset transistor 4. When the capacitance addition transistor 32 is turned on, one electrode of the capacitor 33 is the same node as the FD 3, and increases the capacitance of the FD 3. That is, the capacitance of the FD 3 can be switched by an operation of the capacitance addition transistor 32, and the charge-voltage conversion rate in the FD 3 can be switched. In FIG. 15A as well, the metal portion 18 has the opening 402 and the opening 701. In addition, the side plane of the metal portion 18 is positioned above the gate electrode 2. With such a structure, it is possible to reduce the mixing of stray light, and to suppress an increase in capacitance of the FD 3. In this case, the increase in capacitance of the FD 3 can be suppressed, to thereby be able to suppress the increase in capacitance of the FD 3 exhibited when the capacitance addition transistor 32 is turned off. Therefore, it is possible to increase a difference between the capacitance of the FD 3 exhibited when the capacitance addition transistor 32 is turned on and the capacitance of the FD 3 exhibited when the capacitance addition transistor 32 is turned off.

FIG. 15A is a schematic planar view of the photoelectric conversion apparatus according to Example 5. FIG. 15A is the schematic planar view for illustrating the unit cells 20A corresponding to two rows and three columns (2×3 unit cells 20A) of FIG. 14. FIG. 15A is a drawing corresponding to FIG. 7A. In the other structure and the other plan layout that are illustrated in FIG. 15A, the reference symbols and descriptions of the same components as those illustrated in FIG. 3 are omitted. In FIG. 15A, a gate electrode 32 of the capacitance addition transistor and a source/drain region 36 of the capacitance addition transistor are provided between the FD 3 and the gate electrode 4 of the reset transistor. The capacitor 33 includes one electrode 35 and the metal portion 18 serving as another electrode. The electrode 35 is provided above the metal portion 18. In such a planar view as illustrated in FIG. 15A, the area of the electrode 35 is smaller than the area of the metal portion 18. That is, the outer edge of the electrode 35 is located above the metal portion 18, and the metal portion 18 encloses the electrode 35. A contact 1504 is provided in the source/drain region 36 of the capacitance addition transistor, and is electrically connected to a contact 1502 of the electrode 35 of the capacitor 33. The metal portion 18 is provided with a contact 1501 and connected to a predetermined potential. In Example 5, a ground potential is supplied as the predetermined potential. A contact 1503 is a contact provided on the gate electrode 32. In FIG. 15A, the wire 308 for connecting the FD 3 and the gate electrode 5 of the amplifying transistor, which is illustrated in FIG. 7A, is not shown.

Figure 15B:
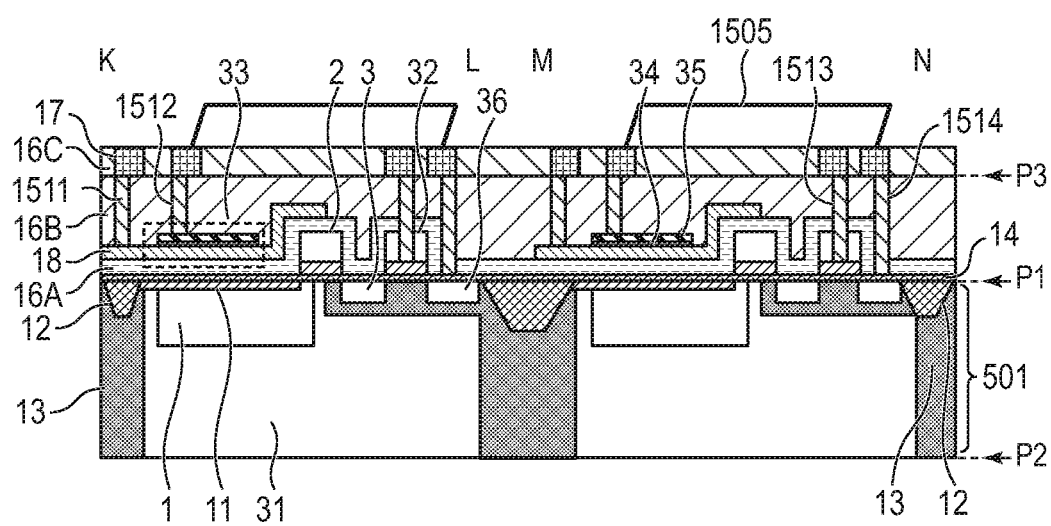
FIG. 15B is a schematic cross-sectional view for illustrating the photoelectric conversion apparatus according to Example 5.

FIG. 15B is a schematic cross-sectional view of the photoelectric conversion apparatus taken along the line K-L and the line M-N in FIG. 15A. In FIG. 15B, the position of the metal portion 18 of the unit cell 20B is the same as that illustrated in FIG. 7B, and hence its description is omitted. In Example 5, a contact plug 1514 of the contact 1504 is provided above the source/drain region 36. The contact plug 1514 is electrically connected to the electrode 35 via a contact plug 1512 of the contact 1502. The contact plug 1514 and the contact plug 1512 are electrically connected to each other by a wire or other such path 1505. The capacitor 33 includes the electrode 35, the metal portion 18, and a dielectric film 34 provided between the electrode 35 and the metal portion 18. The electrode 35 is made of, for example, a conductor including aluminum, titanium, titanium nitride, tungsten, cobalt, and any one of various silicides, or other such metal or metal compound. The dielectric film 34 is made of, for example, a silicon compound including at least oxygen or nitrogen. The dielectric film is made of silicon or hafnium including oxygen or nitrogen. The metal film and the electrode each have a thickness of from about 50 nm to about 2,000 nm, and the dielectric film has a thickness of from about 30 nm to about 50 nm. The capacitor 33 is, for example, a metal insulator metal (MIM) capacitor. At least a part of the metal portion 18 is located between the plane P1 and the plane P3 including the upper planes of a contact plug 1513 and the contact plug 1514 of the contacts. In addition, at least a part of the metal portion 18 is located between the plane including the upper plane of the gate electrode 2 and the plane P1. The dielectric film 34 and the electrode 35 of the capacitor 33 are located on a flat part of the metal portion 18. In addition, at least a part of the dielectric film 34 and the electrode 35 of the capacitor 33 is located between the plane including the upper plane of the gate electrode 2 and the plane P1. With such a structure, the capacitor 33 can be provided on the metal portion 18 in the structure in which the capacitance of the FU 3 can be switched. When a capacitance is formed to the semiconductor substrate 501, there may occur problems of, for example, reduction in area of the photoelectric conversion element and mixing of a charge into the capacitance. However, by providing the capacitor 33 on the metal portion 18, it is possible to suppress an influence exerted on, for example, the photoelectric conversion element.

Sixth Example

In Example 6 of the present disclosure, an example of a photoelectric conversion apparatus is described. The photoelectric conversion apparatus according to Example 6 is configured by stacking at least two semiconductor chips for stacking in an electrically connected state. Such a photoelectric conversion apparatus is also referred to as "stacked photoelectric conversion apparatus". In this case, the semiconductor chip may be referred to as a member or an IC. The plurality of semiconductor chips are electrically connected to each other via a connecting unit.

Figure 16:
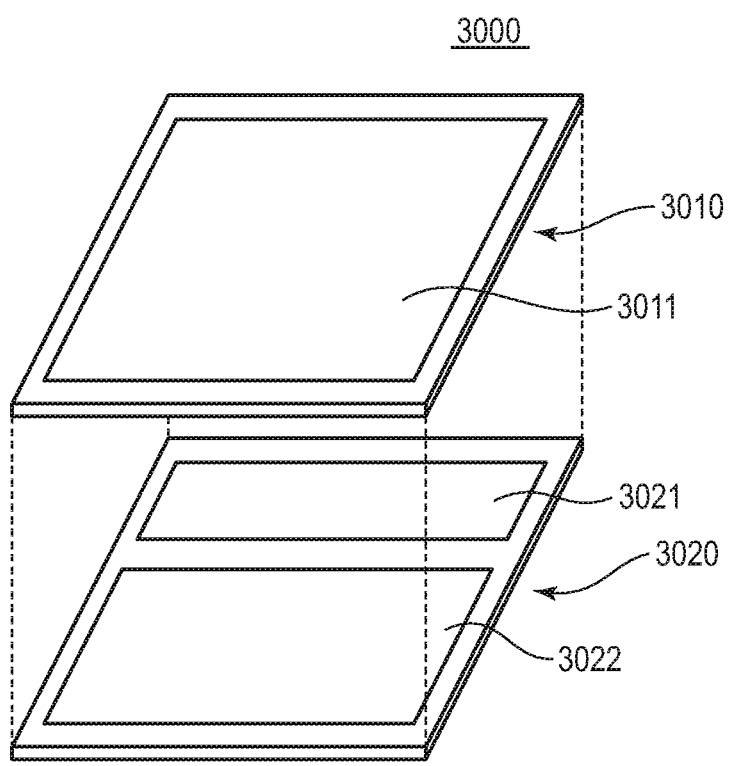
FIG. 16 is a schematic view for illustrating a photoelectric conversion apparatus according to Example 6 of the disclosure.

FIG. 16 is a schematic diagram of a photoelectric conversion apparatus 3000 according to Example 6, and is an exploded perspective view of the photoelectric conversion apparatus 3000. One semiconductor chip 3010 is provided with a photoelectric conversion region 3011. The photoelectric conversion region 3011 is a photoelectric conversion unit in which unit cells including photoelectric conversion elements are arranged, and corresponds to the photoelectric conversion region PA in FIG. 1. Another semiconductor chip 3020 is provided with a controlling unit 3021 and a signal processing unit 3022. The controlling unit 3021 includes, for example, the vertical scanning circuit 101, the horizontal scanning circuit 103, and the control circuit 105, which are illustrated in FIG. 1. The signal processing unit 3022 includes, for example, the signal processing circuit 102 and the output circuit 104, which are illustrated in FIG. 1. The photoelectric conversion region 3011 is superimposed over at least a part of the orthographic projection of the controlling unit 3021 and the signal processing unit 3022 onto the semiconductor chip 3010. In addition, the photoelectric conversion apparatus 3000 according to Example 6 may include a semiconductor chip including another processing circuit, for example, a frame memory, or may include at least three semiconductor chips for stacking.

The controller 3021 can include a power supply circuit and a vertical scanning circuit configured to supply a drive signal to the unit cell. The controlling unit 3021 can also include a horizontal scanning circuit for sequentially reading signals from a timing generation circuit for driving the photoelectric conversion unit, a reference signal supply circuit configured to supply a reference signal to a conversion circuit, an amplifying circuit, or the conversion circuit.

The signal processing unit 3022 processes an electrical signal based on a signal charge generated in the photoelectric conversion region. The signal processing unit 3022 can include a noise reduction circuit, an amplifying circuit, a conversion circuit, and an image signal processing circuit. The noise reduction circuit is, for example, a correlated double sampling (CDS) circuit. The amplifying circuit is, for example, a column amplifying circuit. The conversion circuit is, for example, an analog-to-digital conversion (ADC) circuit formed of a comparator and a counter. The image signal processing circuit, which includes, for example, a memory and a processor, generates image data from a digital signal subjected to analog-to-digital conversion, and performs image processing on the image data.

The present disclosure can also be applied to the photoelectric conversion apparatus according to Example 6 or other such photoelectric conversion apparatus in which a plurality of semiconductor substrates are stacked as in Example 6.

Seventh Example

Figure 17:
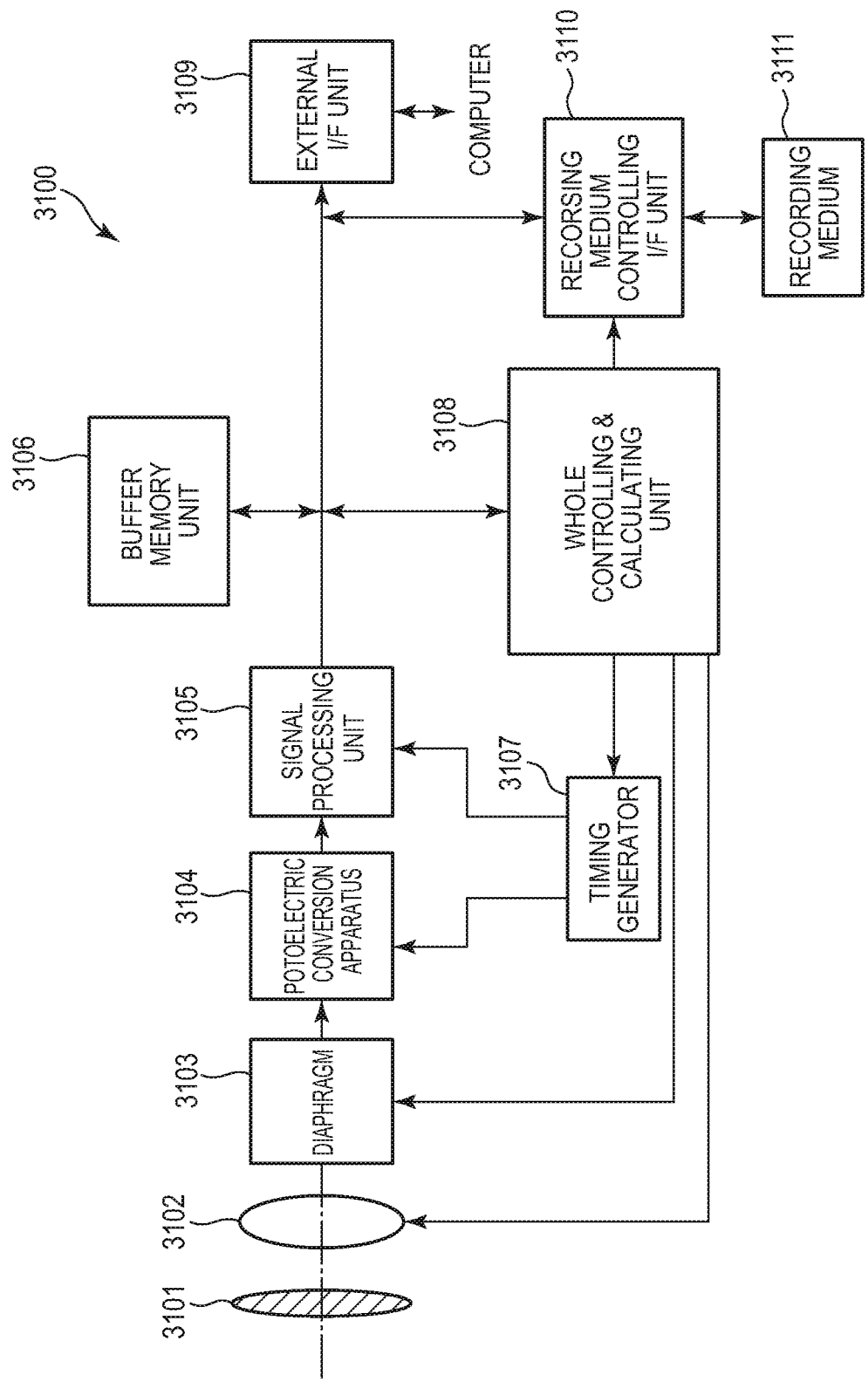
FIG. 17 is a schematic diagram for illustrating a configuration of an imaging system.

FIG. 17 is a block diagram illustrating a configuration of an imaging system 3100 according to Example 7 of the present disclosure. The imaging system 3100 according to Example 7 includes a photoelectric conversion apparatus 3104 described in the above-mentioned examples. In this case, any one of the photoelectric conversion apparatus described in the above-mentioned examples can be employed as the photoelectric conversion apparatus 3104. Specific examples of the imaging system 3100 include a digital still camera, a digital camcorder, and a surveillance camera. In FIG. 17, an example of the digital still camera is illustrated as the imaging system 3100.

The imaging system 3100 illustrated in FIG. 17 includes the photoelectric conversion apparatus 3104, a lens 3102 for forming an optical image of an object on the photoelectric conversion apparatus 3104, a diaphragm 3103 for enabling a variable amount of light passing through the lens 3102, and a barrier 3101 for protecting the lens 3102. The lens 3102 and the diaphragm 3103 form an optical system configured to collect light onto the photoelectric conversion apparatus 3104.

The imaging system 3100 includes a signal processing unit 3105 configured to process an output signal output from the photoelectric conversion apparatus 3104. The signal processing unit 3105 performs a signal processing operation for subjecting the input signal to various kinds of correction and compression as the requirement arises and outputting the processed signal. The imaging system 3100 also includes a buffer memory unit 3106 for temporarily storing image data and an external interface unit (external I/F unit) 3109 for performing communication to/from, for example, an external computer. The imaging system 3100 further includes a semiconductor memory or other such recording medium 3111 for recording or reading imaging data and a recording medium controlling interface unit (recording medium controlling I/F unit) 3110 for performing the recording or reading on the recording medium 3111. The recording medium 3111 may be built into the imaging system 3100, or may be attachably and removably provided. Communication between the recording medium controlling I/F unit 3110 and the recording medium 3111 and communication between the recording medium controlling I/F unit 3110 and the external I/F unit 3109 may be performed in a wireless manner.

The imaging system 3100 further includes a whole controlling & calculating unit 3108 configured to control the entire digital still camera while performing various kinds of calculation and a timing generator 3107 configured to output various timing signals to the photoelectric conversion apparatus 3104 and the signal processing unit 3105. In this case, the timing signal or other such signal may be input from the outside, and it suffices that the imaging system 3100 includes at least the photoelectric conversion apparatus 3104 and the signal processing unit 3105 configured to process the output signal output from the photoelectric conversion apparatus 3104. As described in Example 6, the timing generator 3107 may be mounted to the photoelectric conversion apparatus. The whole controlling & calculating unit 3108 and the timing generator 3107 may be configured to implement a part or all of the control functions of the photoelectric conversion apparatus 3104.

The photoelectric conversion apparatus 3104 outputs a signal for an image to the signal processing unit 3105. The signal processing unit 3105 performs predetermined signal processing on the signal for an image output from the photoelectric conversion apparatus 3104, and outputs image data. The signal processing unit 3105 also generates an image through use of the signal for an image. The signal processing unit 3105 and the timing generator 3107 may be mounted to the photoelectric conversion apparatus. That is, the signal processing unit 3105 and the timing generator 3107 may be provided to a substrate on which unit cells are arranged, or may be provided to another substrate as illustrated in FIG. 16. By configuring an imaging system through use of the photoelectric conversion apparatus according to each of the above-mentioned examples, it is possible to achieve an imaging system capable of acquiring an image with higher quality.

Eighth Example

Figure 19:
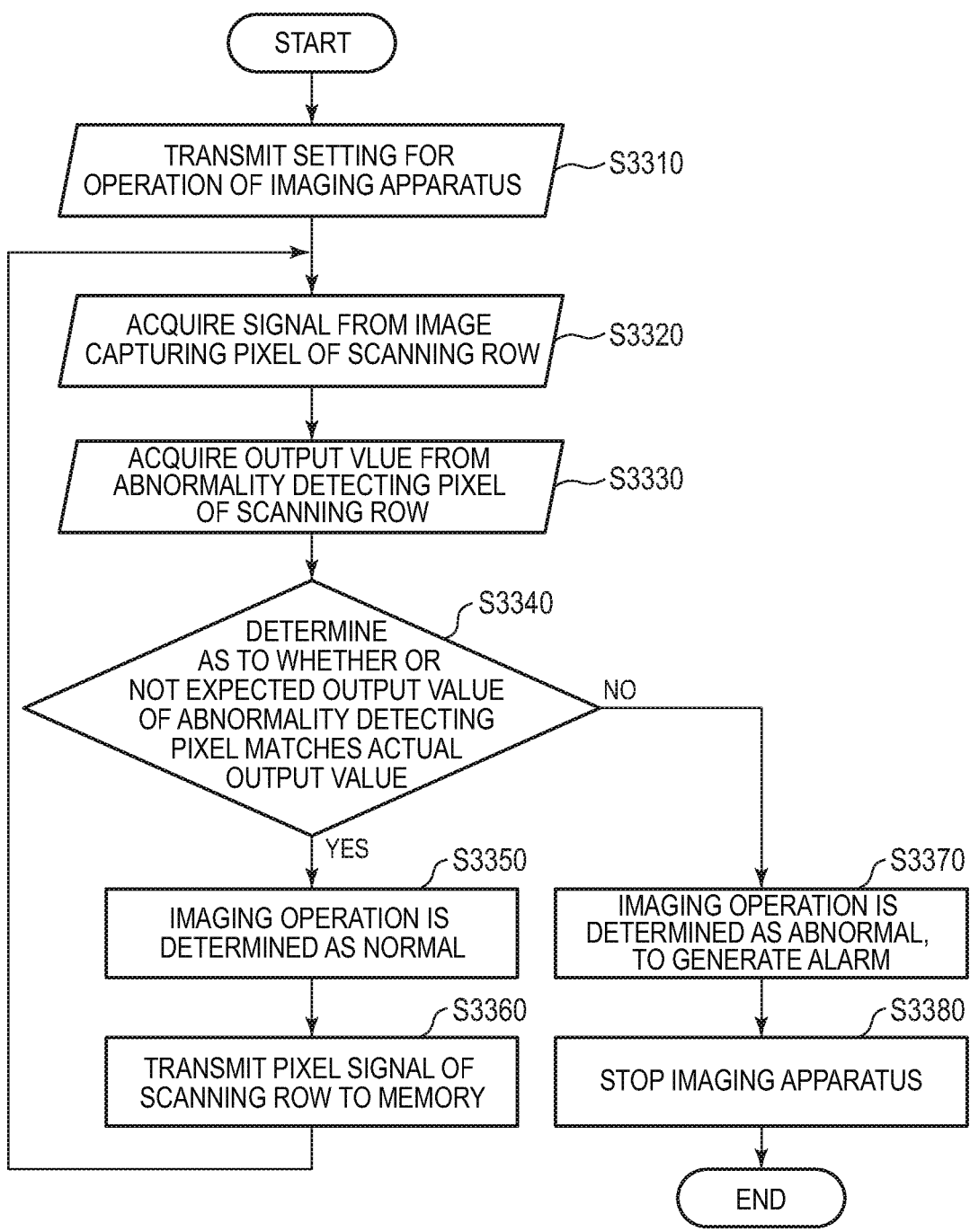
FIG. 19 is a flow chart for illustrating an operation of the movable body.

A movable body according to Example 8 of the present disclosure is described with reference to FIG. 18A, FIG. 18B, and FIG. 19. FIG. 18A and FIG. 18B are schematic diagrams for illustrating a configuration example of the movable body according to Example 8. FIG. 19 is a flow chart for illustrating an operation of an imaging system mounted to the movable body according to Example 8. In Example 8, an example of an on-vehicle camera is illustrated as the imaging system. In the following description, an imaging apparatus refers to the photoelectric conversion apparatus described above, and a pixel corresponds to the unit cell.

In FIG. 18A and FIG. 18B, an example of a vehicle system and an example of the imaging system mounted on the vehicle system are illustrated. An imaging system 3201 includes an imaging apparatus 3202, an image pre-processing unit 3215, an integrated circuit 3203, and an optical system 3214. The optical system 3214 forms an optical image of the object on the imaging apparatus 3202. The imaging apparatus 3202 converts the optical image of the object formed by the optical system 3214 into an electrical signal. The image pre-processing unit 3215 performs pre-determined signal processing on a signal output from the imaging apparatus 3202. The function of the image pre-processing unit 3215 may be incorporated into the imaging apparatus 3202. The imaging system 3201 is provided with at least two sets of optical systems 3214, imaging apparatus 3202, and image pre-processing units 3215 so that output from the image pre-processing unit 3215 of each set is input to the integrated circuit 3203.

An integrated circuit 3203 is an integrated circuit for use in an imaging system, and includes an image processing unit 3204 including a memory 3205, an optical ranging unit 3206, a parallax calculating unit 3207, an object recognizing unit 3208, and an abnormality detecting unit 3209. The image processing unit 3204 subjects the output signal output from the image pre-processing unit 3215 to development processing, defect correction, and other such image processing. The memory 3205 stores temporarily memory of the formed image and a pixel defect position. The optical ranging unit 3206 performs focusing of the object and ranging with respect to the object. The parallax calculating unit 3207 calculates parallax information (phase difference between parallax images) from a plurality of pieces of image data acquired by the plurality of imaging apparatus 3202. The object recognizing unit 3208 recognizes a car, a road, a sign, a person, and other such object. When detecting an abnormality in the imaging apparatus 3202, the abnormality detecting unit 3209 issues a notification of the abnormality to a main controlling unit 3213.

The integrated circuit 3203 may be implemented by exclusively designed hardware, may be implemented by a software module, or may be implemented by a combination thereof. The integrated circuit 3203 may also be implemented by, for example, a field programmable gate array (FPGA) or an application specific integrated circuit (ASIC), or may be implemented by a combination thereof.

The main controlling unit 3213 centrally controls operations of the imaging system 3201, a vehicle sensor 3210, controlling units 3220, and other such components. It is possible to employ a method of providing a communication interface to each of the imaging system 3201, the vehicle sensor 3210, and the controlling units 3220 without providing the main controlling unit 3213 and causing the imaging system 3201, the vehicle sensor 3210, and the controlling units 3220 to transmit and receive a control signal to/from one another through the communication network (for example, CAN standard).

The integrated circuit 3203 has a function of receiving a control signal from the main controlling unit 3213 or causing its own controlling unit to transmit a control signal and a setting value to the imaging apparatus 3202.

The imaging system 3201 is connected to the vehicle sensor 3210, and can detect an own vehicle traveling state including a vehicle speed, a yaw rate, and a steering angle of the own vehicle, an environment outside the own vehicle, and states of other vehicles and obstacles. The vehicle sensor 3210 is also a distance information acquiring unit configured to acquire distance information on a distance from a target object from the parallax images. The imaging system 3201 is also connected to a drive assist controlling unit 3211 configured to perform various kinds of drive assist including automatic steering, automatic cruise, and collision prevention functions. In particular, in regard to a collision determination function, a collision with another vehicle or obstacle is estimated, or presence or absence thereof is determined, based on detection results obtained by the imaging system 3201 and the vehicle sensor 3210. With this function, avoidance control is performed when a collision is estimated, and a safety apparatus is activated when a collision occurs.

In addition, the imaging system 3201 is connected to an alarm unit 3212 configured to issue an alarm to a driver based on a determination result obtained by the collision determination unit. For example, when a high collision possibility is obtained by the collision determination unit as the determination result, the main controlling unit 3213 performs vehicle control for avoiding a collision and reducing damage by applying a brake, returning an accelerator, suppressing engine output, or performing other such operation. The alarm unit 3212 warns a user by, for example, producing a sound or sounding other such alarm, displaying alarm information on a display screen of a car navigation system, a meter panel, or other such component, or applying vibration to a seat belt or a steering wheel.

In Example 8, the imaging system 3201 photographs the surroundings of a vehicle, for example, the front or rear of the vehicle. In FIG. 18B, an arrangement example of the imaging system 3201 for a case in which the imaging system 3201 picks up an image of the front of the vehicle is illustrated.

Two imaging apparatus 3202 are arranged in the front of a vehicle 3200. Specifically, it is preferred that, assuming that a center line with respect to a forward/backward direction or an outer shape (for example, vehicle width) of the vehicle 3200 is regarded as a symmetry axis, the two imaging apparatus 3202 be arranged line-symmetrically with respect to the symmetry axis, in terms of obtaining distance information on a distance between the vehicle 3200 and a target object and determining the collision possibility. In addition, the imaging apparatus 3202 is preferred to be arranged so as to avoid obstructing the driver's field of vision when the driver visually recognizes the situation outside the vehicle 3200 from a driver's seat. The alarm unit 3212 is preferred to be arranged so as to easily enter the driver's field of vision.

Next, an abnormality detecting operation of the imaging apparatus 3202 in the imaging system 3201 is described with reference to FIG. 19. The abnormality detecting operation is performed by the imaging apparatus 3202 in accordance with Step S3310 to Step S3380 illustrated in FIG. 19.

Step S3310 is the step of performing a setting at the time of startup of the imaging apparatus 3202. That is, a setting for the operation of the imaging apparatus 3202 is transmitted from the outside of the imaging system 3201 (for example, main controlling unit 3213) or the inside of the imaging system 3201, to thereby start the imaging operation and abnormality detecting operation of the imaging apparatus 3202.

Subsequently, in Step S3320, a pixel signal is acquired from an effective pixel. Then, in Step S3330, an output value from an abnormality detecting pixel provided for detecting an abnormality is acquired. This abnormality detecting pixel includes a photoelectric conversion unit as with the effective pixel. A predetermined voltage is written to the photoelectric conversion unit. The abnormality detecting pixel outputs a signal corresponding to the voltage written to the photoelectric conversion unit. Step S3320 and Step S3330 may be performed in a reverse order.

Subsequently, in Step S3340, it is determined whether or not an expected output value from the abnormality detecting pixel matches an actual output value from the abnormality detecting pixel. As a result of the determination performed in Step S3340, when the expected output value coincides with the actual output value, the processing step proceeds to Step S3350 to determine that the imaging operation is performed normally, and the processing step proceeds to Step S3360. In Step S3360, the pixel signal for the scanning row is transmitted to the memory 3205 to be temporarily stored in the memory 3205. After that, the processing step returns to Step S3320 to continue the abnormality detecting operation. Meanwhile, as a result of the determination performed in Step S3340, when the expected output value does not coincide with the actual output value, the processing step proceeds to Step S3370. In Step S3370, the imaging operation is determined as abnormal, and an alarm is issued to the main controlling unit 3213 or the alarm unit 3212. The alarm unit 3212 displays on a display that an abnormality has been detected. After that, in Step S3380, the imaging apparatus 3202 is stopped, and the operation of the imaging system 3201 is brought to an end.

In Example 8, an exemplary case of looping the flow chart for each row is described, but the flow chart may be looped for each plurality of rows, or the abnormality detecting operation may be performed for each frame. In Step S3370, the alarm may also be issued to the outside of the vehicle through a wireless network.

In Example 8, the control for avoiding a collision with another vehicle has been described, but the present disclosure can also be applied to, for example, control for automatically driving by following another vehicle or control for automatically driving so as to avoid deviating from the lane. The imaging system 3201 can also be applied not only to the own vehicle or other such vehicle but also to a movable body (movable apparatus), for example, a vessel, an aircraft, or an industrial robot. In addition, the present disclosure can be applied not only to the movable body but also to an intelligent road traffic system (ITS) or other such apparatus for use in a wide variety of object recognition.

The photoelectric conversion apparatus according to at least one example of the present disclosure may further have a configuration including a color filter or a micro lens, or may have a configuration capable of acquiring various kinds of information including distance information. For example, a plurality of photoelectric conversion elements may be provided for one input node, or one common micro lens may be provided to a plurality of photoelectric conversion elements. The amplifying transistor is a part of a source follower circuit, but may form a part of an A/D converter. Further, the unit cell may be configured so that the photoelectric conversion element is directly connected to the input node without being provided with the transfer transistor. Furthermore, an overflow drain or other such charge discharging unit may be provided.

The present disclosure is not limited to the above-mentioned examples, and various modifications can be made. For example, an example in which a part of the configurations in any one of the examples is added to another example, or an example in which a part of the configurations in any one of the examples is replaced by a part of the configuration in another example is also at least one example of the present disclosure. The examples described above both merely describe embodied examples for carrying out the present disclosure. Therefore, the technical scope of the present disclosure should not be read as restrictive by the exemplary examples described above. Specifically, the present disclosure can be carried out in various modes without departing from the technical ideas or main characteristics of the present disclosure.

While the present disclosure has been described with reference to exemplary examples, it is to be understood that the disclosure is not limited to the disclosed exemplary examples. The scope of the following claims is to be accorded the broadest interpretation so as to encompass all such modifications and equivalent structures and functions.

This application claims the benefit of Japanese Patent Application No. 2018-200105, filed Oct. 24, 2018, which is hereby incorporated by reference herein in its entirety.

What is claimed is:

1. A photoelectric conversion apparatus comprising:
   - a semiconductor substrate having a first plane and a second plane, wherein the second plane is entered by light;
   - a first photoelectric conversion element and a second photoelectric conversion element, the first and second photoelectric conversion elements being arranged along a first direction, the first direction being parallel to the first plane;
   - a floating diffusion region arranged on a first plane side of the semiconductor substrate, arranged between the first and second photoelectric conversion elements, and configured to hold a charge generated by the photoelectric conversion element;
an amplifying transistor arranged on the first plane side of the semiconductor substrate, and including a first gate electrode;
a first contact plug arranged on the first plane side of the semiconductor substrate, and connected to the floating diffusion region;
a second contact plug arranged on the first plane side of the semiconductor substrate, and connected to the first gate electrode;
a wire arranged on the first plane side of the semiconductor substrate, having a first part connected to the first contact plug, a second part connected to the second contact plug, and a third part between the first part and the second part, and configured to electrically connect the first gate electrode and the floating diffusion region to each other; and
a first metal portion arranged between the first plane and a third plane, and extending from at least a part of the first photoelectric conversion element to at least a part of the second photoelectric conversion element through the floating diffusion region in a planar view, wherein the third plane including a plane of the first contact plug on which the first contact plug is connected to the wire,
wherein the first metal portion has an opening on which at least a part of the third part of the wire is superimposed in a planar view,
wherein the first metal portion has a first portion and a second portion, the first portion being located between the first plane and a fourth plane including a surface of the first gate electrode on a third plane side, the first portion being located over the first photoelectric conversion element, the second portion being located between the fourth plane and the third plane, and the second portion being located over the first gate electrode.

2. The photoelectric conversion apparatus according to claim 1, wherein the opening encloses the wire in a planar view.

3. The photoelectric conversion apparatus according to claim 1, wherein the opening encloses the floating diffusion region in a planar view.

4. The photoelectric conversion apparatus according to claim 1, wherein the opening encloses the first gate electrode in a planar view.

5. The photoelectric conversion apparatus according to claim 1, further comprising a second gate electrode configured to transfer the charge generated by the first photoelectric conversion element,
wherein the first metal portion superimposes on a region from the first photoelectric conversion element to the second gate electrode in a planar view.

6. The photoelectric conversion apparatus according to claim 1, further comprising an insulator pattern provided on the third plane side of the first gate electrode,
wherein the first metal portion has at least a part located between the first plane and a fifth plane including a plane of the insulator pattern on the third plane side.

7. The photoelectric conversion apparatus according to claim 1, wherein the first metal portion includes a film made of at least one layer of tungsten as a main component.

8. The photoelectric conversion apparatus according to claim 1, further comprising a capacitor connected to the floating diffusion region via a switch,
wherein the capacitor includes:
a first electrode formed of the first metal portion;
a second electrode provided between the first electrode and the third plane; and
a dielectric film provided between the first electrode and the second electrode.

9. The photoelectric conversion apparatus according to claim 8, wherein the first metal portion encloses the second electrode in in a planar view.

10. An imaging system comprising:
the photoelectric conversion apparatus of claim 1; and
a signal processor configured to process a signal received from the photoelectric conversion apparatus.

11. A movable body comprising:
the photoelectric conversion apparatus of claim 1;
a sensor configured to acquire distance information on a distance from a target object from parallax information based on a signal received from the photoelectric conversion apparatus; and
a controller configured to control the movable body based on the distance information.

12. The photoelectric conversion apparatus according to claim 1, further comprising:
a third photoelectric conversion element arranged in the semiconductor substrate, the first and third photoelectric conversion elements being arranged along a second direction, the second direction being parallel to the second plane,
wherein a second metal portion is arranged on at least a part of the third photoelectric conversion element, the first and second metal portions being separated from each other in a region including a part of the first and third photoelectric conversion elements.

13. The photoelectric conversion apparatus according to claim 1, wherein a distance between a surface of the first portion of the first metal portion and the first plane is shorter than a distance between a surface of the second portion of the first metal portion and the first plane.

14. The photoelectric conversion apparatus according to claim 1, further comprising a capacitor connected to the floating diffusion region via a switch,
wherein the capacitor includes:
a first electrode formed of at least the first portion of the first metal portion;
a second electrode provided between the first electrode and the third plane; and
a dielectric film provided between the first electrode and the second electrode,
wherein the second electrode is arranged over the first portion in a planar view.

15. The photoelectric conversion apparatus according to claim 12,
wherein the semiconductor substrate includes:
an isolation region between the first photoelectric conversion element and the third photoelectric conversion element, and
wherein the first metal portion has an opening superimposed over at least a part of the isolation region in a planar view.

16. The photoelectric conversion apparatus according to claim 5,
wherein the first portion covers at least a part of the first photoelectric conversion element and the second portion covers at least a part of the second gate electrode, and wherein a distance between the first plane and a top face of the first portion is longer than a distance between the first plane and a top face of the second portion.

17. A photoelectric conversion apparatus comprising:
a semiconductor substrate having a first plane and a second plane, the second plane being entered by light;
a first photoelectric conversion element, a second photoelectric conversion element, a third photoelectric conversion element, and an isolation region between the first and third photoelectric conversion elements, wherein the first and second photoelectric conversion elements are arranged along a first direction, the first and third photoelectric conversion elements are arranged along a second direction, and the first and second directions are parallel to the first plane;
a gate electrode arranged on a first plane side of the semiconductor substrate, and configured to transfer a charge of the first photoelectric conversion element;
a contact plug arranged on the first plane side of the semiconductor substrate, and connected to the gate electrode; and
a first metal portion provided between the first plane and a third plane, and extending from at least a part of the first photoelectric conversion element to at least a part of the second photoelectric conversion element through a floating diffusion region in a planar view, wherein the third plane includes a plane of the contact plug opposite to a plane connected to the gate electrode,
wherein the first metal portion has an opening superimposed on at least a part of the isolation region in a planar view, and
wherein the first metal portion has a first portion and a second portion, the first portion being located between the first plane and a fourth plane including a surface of the gate electrode on a third plane side, the first portion being located over the first photoelectric conversion element, the second portion being located between the fourth plane and third plane, and the second portion being located over the gate electrode.

18. The photoelectric conversion apparatus according to claim 17,
wherein the first photoelectric conversion element, the third photoelectric conversion element, and the isolation region are arranged along the second direction in a planar view, and
wherein the opening has a width in the first direction smaller than a width of the isolation region in the second direction.

19. An imaging system comprising:
the photoelectric conversion apparatus of claim 17; and
a signal processor configured to process a signal received from the photoelectric conversion apparatus.

20. A movable body comprising:
the photoelectric conversion apparatus of claim 17;
a sensor configured to acquire distance information on a distance from a target object from parallax information based on a signal received from the photoelectric conversion apparatus; and
a controller configured to control the movable body based on the distance information.

21. The photoelectric conversion apparatus according to claim 17, wherein a distance between a surface of the first portion of the first metal portion and the first plane is shorter than a distance between a surface of the second portion of the first metal portion and the first plane.

22. The photoelectric conversion apparatus according to claim 17, further comprising a capacitor connected to the floating diffusion region via a switch,
wherein the capacitor includes:
a first electrode formed of at least the first portion of the first metal portion;
a second electrode provided between the first electrode and the third plane; and
a dielectric film provided between the first electrode and the second electrode,
wherein the second electrode is arranged over the first portion in a planar view.

23. A semiconductor chip for stacking comprising:
a semiconductor substrate having a first plane and a second plane, wherein the second plane is entered by light;
a first photoelectric conversion element and a second photoelectric conversion element, the first and second photoelectric conversion elements being arranged along a first direction, and the first direction being parallel to the first plane;
a floating diffusion region arranged on a first plane side of the semiconductor substrate, arranged between the first and second photoelectric conversion elements, and configured to hold a charge generated by at least the first photoelectric conversion element;
an amplifying transistor arranged on the first plane side of the semiconductor substrate, and including a first gate electrode;
a first contact plug arranged on the first plane side of the semiconductor substrate, and connected to the floating diffusion region;
a second contact plug arranged on the first plane side of the semiconductor substrate, and connected to the first gate electrode;
a wire arranged on the first plane side of the semiconductor substrate, having a first part connected to the first contact plug, a second part connected to the second contact plug, and a third part between the first part and the second part, and configured to electrically connect the first gate electrode and the floating diffusion region to each other;
a first metal portion arranged between the first plane and a third plane, extending from at least a part of the first photoelectric conversion element to at least a part of the second photoelectric conversion element through the floating diffusion region in a planar view, having an opening over which at least a part of the third part of the wire is superimposed in a planar view, and having a first portion and a second portion, the first portion being located between the first plane and a fourth plane including a surface of the first gate electrode on a third plane side, the first portion being located over the first photoelectric conversion element, the second portion being located between the fourth plane and the third plane, and the second portion being located over the first gate electrode, wherein the third plane includes a plane of the first contact plug on which the first contact plug is connected to the wire; and
a connector configured to output a signal based on at least the first photoelectric conversion element to another semiconductor chip.

24. The semiconductor chip according to claim 23, wherein a distance between a surface of the first portion of the first metal portion and the first plane is shorter than a distance between a surface of the second portion of the first metal portion and the first plane.

25. The semiconductor chip according to claim 23, further comprising a capacitor connected to the floating diffusion region via a switch,
   wherein the capacitor includes:
   a first electrode formed of at least the first portion of the first metal portion;
   a second electrode provided between the first electrode and the third plane; and
   a dielectric film provided between the first electrode and the second electrode,
   wherein the second electrode is arranged over the first portion in a planar view.

* * * * *